United States Patent
Wu et al.

(10) Patent No.: US 11,632,130 B2
(45) Date of Patent: Apr. 18, 2023

(54) PCI EXPRESS ENHANCEMENTS

(71) Applicant: Intel Corporation, Santa Clara, CA (US)

(72) Inventors: Zuoguo Wu, San Jose, CA (US); Debendra Das Sharma, Saratoga, CA (US); Md. Mohiuddin Mazumder, San Jose, CA (US); Subas Bastola, Santa Clara, CA (US); Kai Xiao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/681,364

(22) Filed: Feb. 25, 2022

(65) Prior Publication Data

US 2022/0255559 A1    Aug. 11, 2022

Related U.S. Application Data

(60) Continuation of application No. 16/563,496, filed on Sep. 6, 2019, now Pat. No. 11,283,466, which is a division of application No. 15/851,747, filed on Dec. 22, 2017, now Pat. No. 11,043,965, which is a continuation of application No. 15/039,544, filed as application No. PCT/US2013/077762 on Dec. 26, 2013, now abandoned.

(51) Int. Cl.
| | |
|---|---|
| *H03M 13/11* | (2006.01) |
| *G06F 13/38* | (2006.01) |
| *G06F 13/36* | (2006.01) |
| *G06F 13/40* | (2006.01) |
| *G06F 13/42* | (2006.01) |

(52) U.S. Cl.
CPC ............. *H03M 13/11* (2013.01); *G06F 13/36* (2013.01); *G06F 13/385* (2013.01); *G06F 13/4068* (2013.01); *G06F 13/4282* (2013.01); *G06F 2213/0026* (2013.01)

(58) Field of Classification Search
None
See application file for complete search history.

(56) References Cited

U.S. PATENT DOCUMENTS

| | | |
|---|---|---|
| 4,631,666 A | 12/1986 | Harris et al. |
| 6,961,347 B1 | 11/2005 | Bunton et al. |
| 7,010,607 B1 | 3/2006 | Bunton |
| 7,444,558 B2 | 10/2008 | Mitbander et al. |

(Continued)

FOREIGN PATENT DOCUMENTS

| | | |
|---|---|---|
| CN | 1227023 A | 8/1999 |
| CN | 101208898 A | 6/2008 |

(Continued)

OTHER PUBLICATIONS

Brazil Patent Office; Office Action issued in BR Patent Application No. BR112016012048-5, dated Feb. 15, 2022; 8 pages including English machine translation.

(Continued)

*Primary Examiner* — Guerrier Merant
(74) *Attorney, Agent, or Firm* — Alliance IP, LLC

(57) ABSTRACT

An identification is made that a link is to exit an active state, the link comprising a plurality of lanes. Parity information is maintained for the lanes based on data previously sent over the link, and an indication of the parity information is sent prior to the exit from the active state.

23 Claims, 19 Drawing Sheets

(56) References Cited

U.S. PATENT DOCUMENTS

| | | | |
|---|---|---|---|
| 7,917,828 | B2 | 3/2011 | Tate et al. |
| 8,161,210 | B1 | 4/2012 | Norrie |
| 8,644,829 | B2 | 2/2014 | Islam et al. |
| 9,281,970 | B2 | 3/2016 | Ran |
| 2004/0204912 | A1 | 10/2004 | Nejedlo et al. |
| 2005/0215085 | A1 | 9/2005 | Mehta et al. |
| 2006/0212775 | A1 | 9/2006 | Cypher |
| 2007/0005248 | A1 | 1/2007 | Averill et al. |
| 2007/0011549 | A1 | 1/2007 | Sharma |
| 2007/0089035 | A1 | 4/2007 | Alexander et al. |
| 2008/0005706 | A1 | 1/2008 | Sharma et al. |
| 2009/0323722 | A1 | 12/2009 | Sharma |
| 2010/0085873 | A1 | 4/2010 | Moons |
| 2010/0229071 | A1 | 9/2010 | Ganga et al. |
| 2010/0251001 | A1 | 9/2010 | Drescher et al. |
| 2012/0166701 | A1 | 6/2012 | Oh et al. |
| 2012/0320932 | A1 | 12/2012 | Xu et al. |
| 2013/0232279 | A1 | 9/2013 | Adar et al. |
| 2014/0112339 | A1 | 4/2014 | Safranek et al. |
| 2014/0189427 | A1 | 7/2014 | Bharadwaj et al. |
| 2015/0180790 | A1 | 6/2015 | Rimmer et al. |

FOREIGN PATENT DOCUMENTS

| | | | |
|---|---|---|---|
| CN | 101631000 | A | 1/2010 |
| CN | 102546515 | A | 7/2012 |
| EP | 830017 | A3 | 9/1998 |
| JP | H08286993 | A | 11/1996 |
| JP | 2008059134 | A | 3/2008 |
| JP | 2008262538 | A | 10/2008 |
| JP | 2010011454 | A | 1/2010 |
| JP | 2010061606 | A | 3/2010 |
| JP | 2012120158 | A | 6/2012 |
| KR | 20070111398 | A | 11/2007 |
| WO | 2010103564 | A1 | 9/2010 |
| WO | 2013176953 | A1 | 11/2013 |
| WO | 2015099724 | A1 | 7/2015 |

OTHER PUBLICATIONS

German Patent Office; Office Action issued in DE Patent Application No. 112013007732.9, dated Aug. 14, 2022; 4 pages.
German Patent Office; Office Action issued in DE Patent Application No. 112013007769.8, dated Aug. 14, 2022; 4 pages.
Brazil Patent Office; Office Action issued in BR Patent Application No. BR112016012048-5, dated Jan. 28, 2020; 4 pages without English translation.
Chen, Xiumei, et al.; "An Alternating-Complementary Self-Recovering Method Based on Dual FSMs," Journal of Computer and Research Development; Jan. 15, 2012; 7 pages including English abstract.
Extended European Search Report for EP Application No. 18165257.9, dated Jul. 9, 2018, 7 pages.
Extended European Search Report for European Patent Application No. 13900152.3 dated Jul. 24, 2017, 5 pages.
First Office Action for Chinese Patent Application No. 201380081346.2 dated Mar. 16, 2018, 22 pages with translation.
German Patent Office; Office Action issued in DE Patent Application No. 112013007732.9, dated Nov. 12, 2021; 15 pages.
German Patent Office; Office Action issued in DE Patent Application No. 112013007769.8, dated Nov. 12, 2021; 14 pages.
India Patent Office; First Office Action issued in IN Patent Application No. 201647015459, dated May 29, 2020; 7 pages including English translation.
International Preliminary Report on Patentability and Written Opinion in International Application No. PCT/US2013/077762 dated Jun. 28, 2016.
International Search Report and Written Opinion in International Application No. PCT/US2013/077762 dated Sep. 24, 2014.
Japan Decision to Grant in Japanese Patent Application No. 2016-532604 dated Sep. 29, 2017, 1 page.
Japan Patent Office, Office Action issued for Japanese Patent Application No. 2017-226906, dated Feb. 19, 2019; 8 pages with English translation.
Japan Patent Office; Decision of Refusal issued in Japanese Patent Application No. JP 2019-123857, dated Mar. 30, 2021; 5 pages including English translation.
Japan Patent Office; Office Action issued in Japanese Patent Application No. JP 2019-123857, dated Sep. 15, 2020; 8 pages including English translation.
Japan Patent Office; Reconsideration Report before Appeal issued in JP Patent Application No. 2019-123857, dated Sep. 3, 2021; 9 pages including English translation.
KIPO, Notice of Preliminary Rejection for Korean Patent Application No. 2018-7016714, dated Feb. 27, 2019; 3 pages with English translation.
KIPO, Notice of Preliminary Rejection in Korean Patent Application No. 2016-7013929 dated Sep. 14, 2017 (4 pages) with English translation (3 pages).
Notice of Allowance for Korean Patent Application No. 10-2016-7013929 dated Mar. 28, 2018, 3 pages with translation.
Notice of Allowance for Russian Patent Application No. RU2016120768, dated Oct. 25, 2017, 11 pages—English Translation Not Available.
Notice of Reasons for Rejection in Japanese Patent Application No. 2016-532604 dated Jun. 6, 2017, 9 pages (with machine translation).
Official Action in Russian Patent Application No. 2016120768 dated Jul. 4, 2017, 10 pages with translation.
PCI Express Base Specification, Rev. 3.0; 2010; pp. 210-212.
Second Office Action for Chinese Patent Application No. CN201380081346.2, dated Nov. 20, 2018, 7 pages.
Sinharoy, B., et al.; "IBM POWER7 Multicore Server Processor," IBM Journal of Research and Development, vol. 55, No. 3; Apr. 2011; 29 pages.
SIPO; First Office Action issued in Chinese Patent Application No. 201810010810.3, dated Sep. 14, 2020; 13 pages including English translation.
Japan Patent Office; Office Action issued in JP Patent Application No. 2019-123857, dated Apr. 27, 2022; 28 pages including English translation.

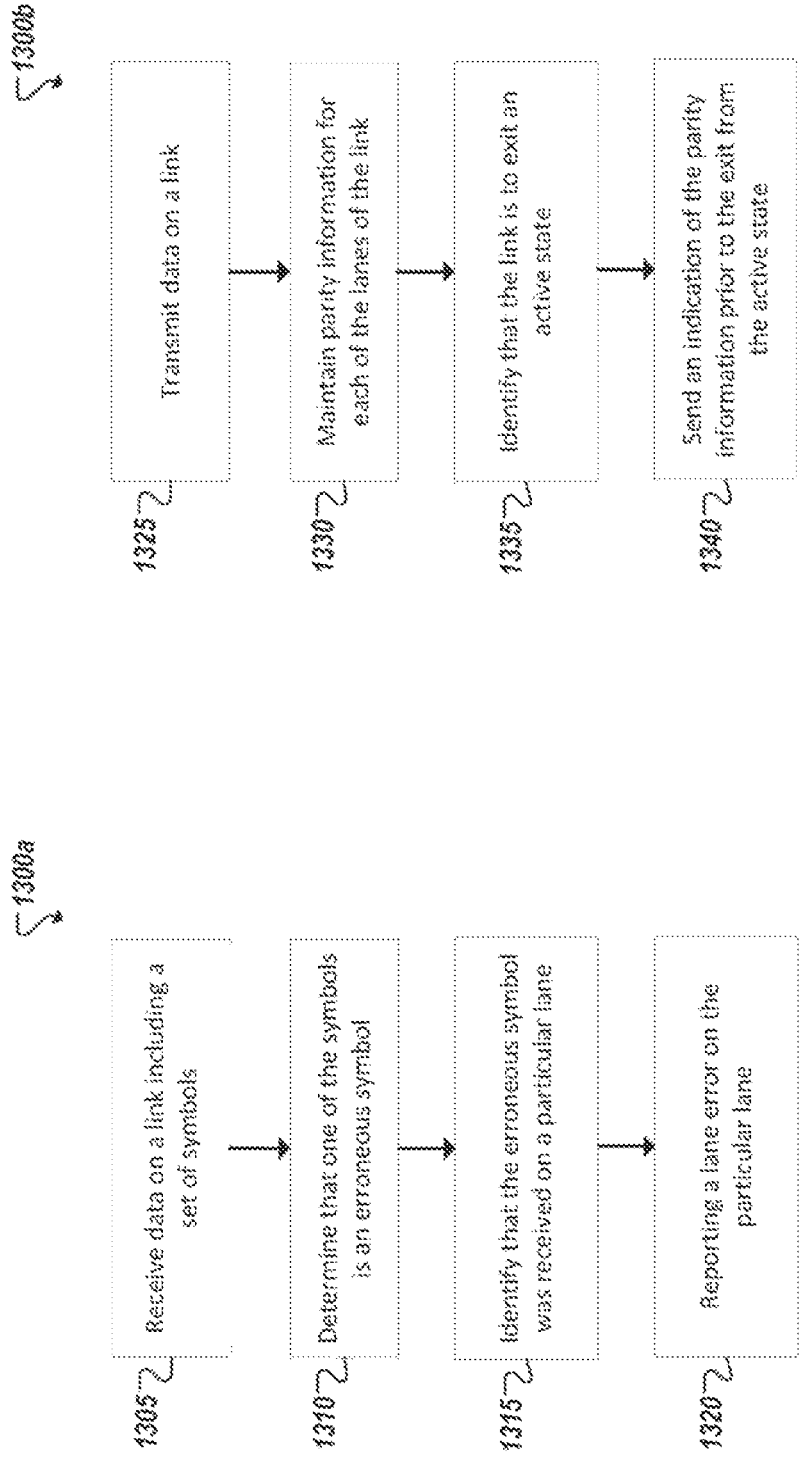

PCI EXPRESS ENHANCEMENTS

This application is a continuation of U.S. application Ser. No. 16/563,496, filed Sep. 6, 2019, which is a division of U.S. application Ser. No. 15/851,747, filed Dec. 22, 2017, now U.S. Pat. No. 11,043,965, which is a continuation of U.S. application Ser. No. 15/039,544, filed May 26, 2016, which is a national stage application under 35 U.S.C. § 371 of PCT International Application Serial No. PCT/US2013/077762, filed on Dec. 26, 2013 and entitled "PCI EXPRESS ENHANCEMENTS", which application which is considered part of and is hereby incorporated by reference in its entirely in the disclosure of this application.

FIELD

Background

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIGS. 13A-13D are flowcharts illustrating example techniques for reporting lane errors of a link.

Like reference numbers and designations in the various drawings indicate like elements.

DETAILED DESCRIPTION

Figure 1:
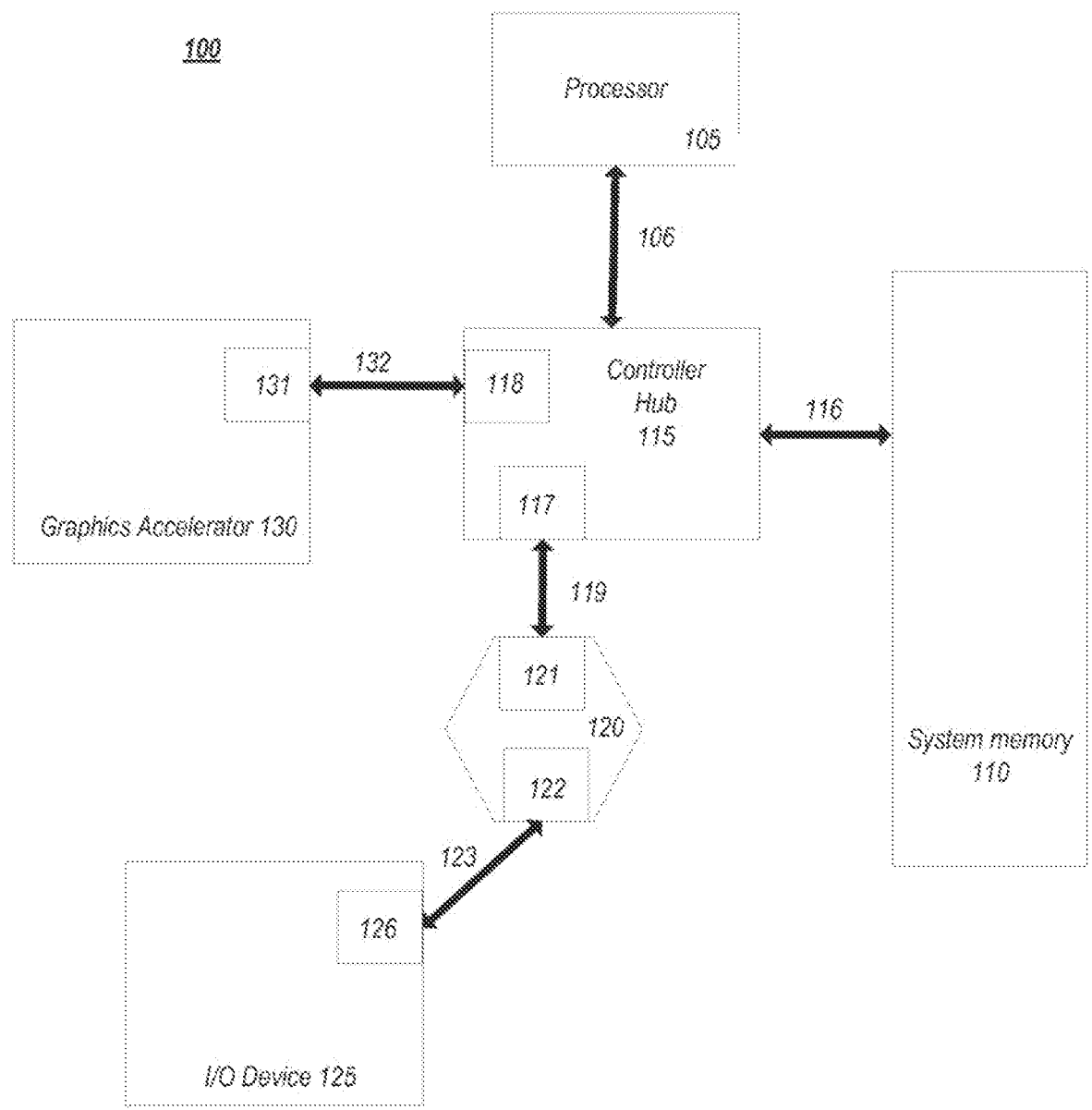
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105.

Figure 2:
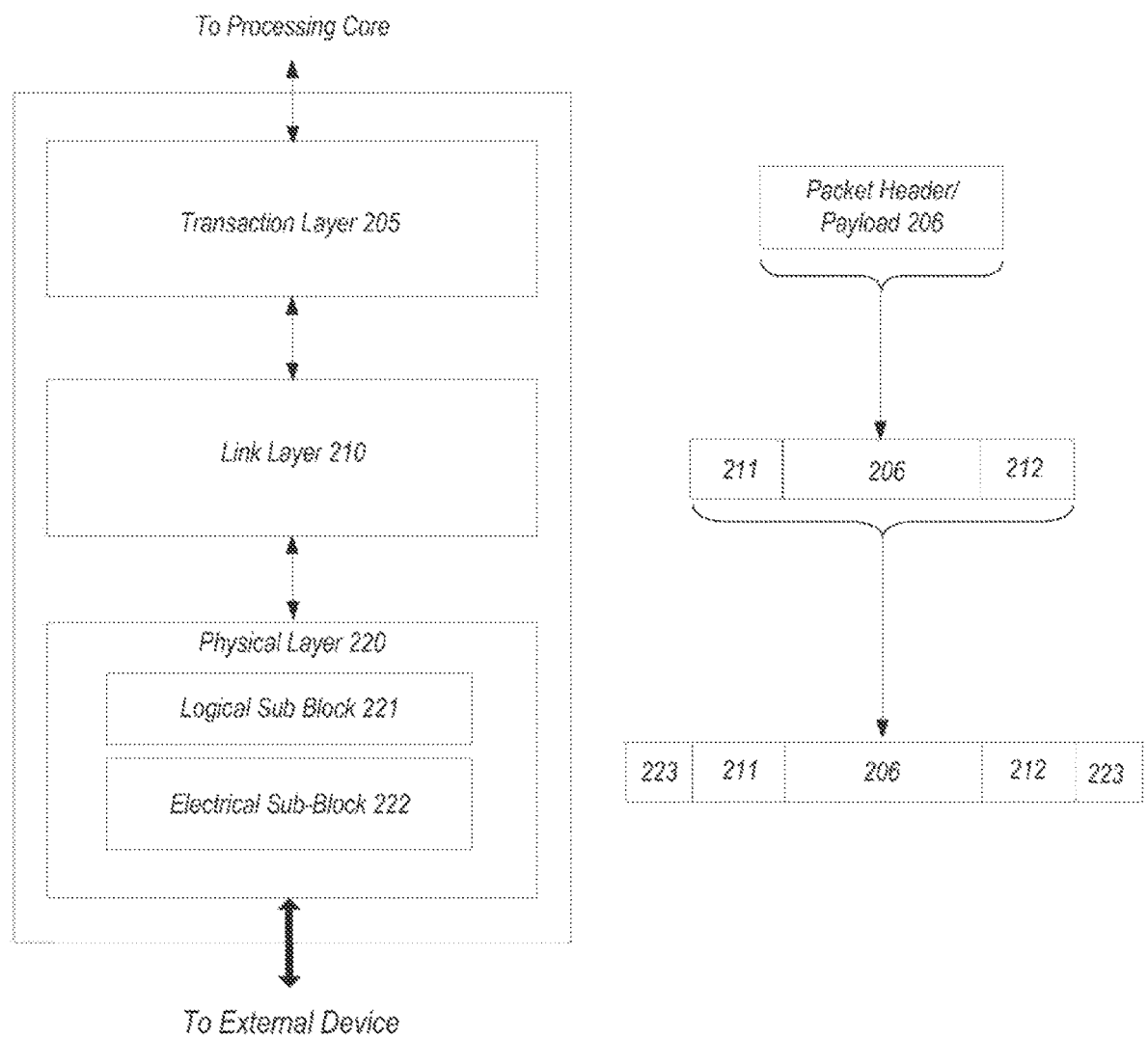
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCIe stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification at the PCIe specification website.

Figure 3:
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8 b/10 b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
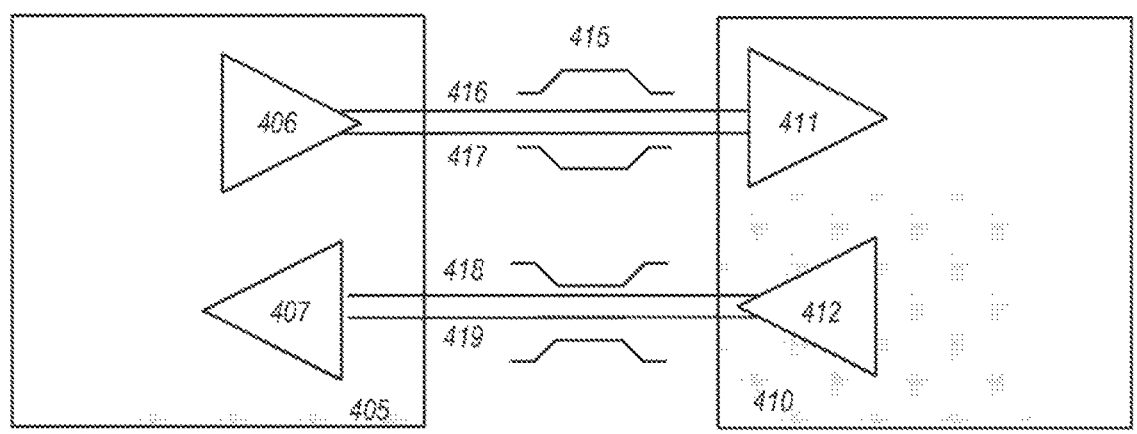
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by ×N, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

High Speed Channel

A revision to the PCIe I/O specification is PCIe revision 4.0 (or PCIe 4.0). At a 16 GT/s bit rate, PCIe 4.0 aims to double the interconnect performance bandwidth over the PCIe 3.0 specification, while preserving compatibility with software and mechanical interfaces. Increasing the performance bandwidth over prior generations of PCIe can provide performance scaling consistent with increasing bandwidth demand from a variety of developing applications while also aiming to provide low cost, low power and minimal perturbations at the platform level. One of the main factors in the wide adoption of the PCIe architecture is its sensitivity to high-volume manufacturing capabilities and materials such as lower cost circuit boards, low-cost connectors, and so on.

The 16 GT/s bit rate aims to provide an optimum tradeoff between performance, manufacturability, cost, power and compatibility. Feasibility analyses have been performed to recommend characteristics for devices and channels that support the 16 GT/s bit rate for PCIe 4.0. PCI-SIG analysis covered multiple topologies. For instance, analyses have determined that 16 GT/s on copper, which will double the bandwidth over the PCIe 3.0 specification, is technically feasible at approximately PCIe 3.0 power levels. Here, a 16 GT/s interconnect is potentially manufactured in mainstream silicon process technology and deployed with existing low-cost materials and infrastructure, while maintaining compatibility with previous generations of PCIe architecture.

Higher data rate serial I/O (e.g., 1.6 GT/s under PCIe 4.0) would dissipate significant power, and increased circuit complexity that potentially leads to increased silicon (Si) area use. These considerations further have the potential, to limit the integration of PCIe 4.0 (and other such high speed interconnect architectures) into CPUs and systems that utilize larger lane counts. In some example implementations, for instance, limitations are placed on the interconnect length and the number of connectors that are employed within a high-speed architecture, such as PCIe 4.0. For instance, such limitation is defined at the specification level. In one example, interconnect channel length is limited to one (1) connector and twelve (12) or fewer inches.

Placing limitations on interconnector channels can limit their application to some systems. For instance, in server interconnect applications, platform interconnects can sometimes be up to twenty (20) inches or longer and have two connectors. Were an architecture to restrict interconnect channels to a maximum of 12" in length and a single connector, a separate repeater chip or other additional device would be included in order to combine two of the 12" channels and accommodate the distances between devices in the server system, among potentially other examples.

In some implementations, an interconnect link can be provided that is configured to comply with PCIe 4.0 and other interconnects, permitting a two connector channel greater than or equal to twenty inches in length while still supporting 16 GT/s data communication speeds. For instance, circuit and interconnect can be co-optimized such that repeaters and other devices can omitted from longer interconnect channel runs. This can assist in reducing manufacturing costs, reducing I/O latency, and extending applicability of higher bandwidth speeds architectures to additional applications. For instance, a repeater chip can include a transmitter, receiver, clock generation (e.g., phase lock loop (PLL)), clock recovery, and associated logic functions. Such components can utilize valuable board area. Further, for a x16 PCIe 4.0 interconnect, each repeater can dissipate extra power and introduce additional cost into the manufacture of a system, among other potential drawbacks. For instance, repeaters can also introduce additional I/O latency.

Figure 5:
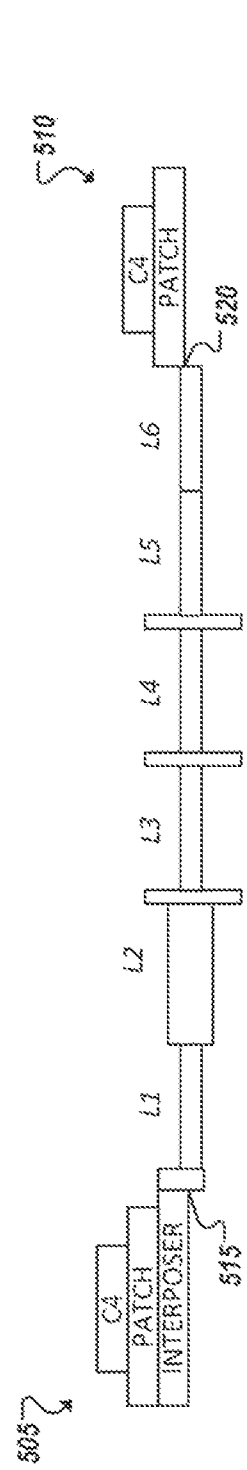
FIG. 5 illustrates an embodiment of an example two connector interconnect channel.

FIG. 5 shows an example two-connector channel configuration. For instance, the channel 500 can include multiple sections, such as sections on the socket (e.g., of a CPU), mother board, adding card, riser board, among other elements over which the channel link can span to connect two devices (e.g., 505, 510) in a system. The channel sections can each have a respective length, in this example, with lengths L1=1", L2=10.5", L3=0.5", L4=4", L5=3", and L6=1", totaling 20" for the total length of the channel 500. The channel can be connected to each device 505, 510 using a respective connector 515, 520 (at each package).

Using traditional techniques, a configuration such as that illustrated in FIG. 5 can yield a negative margin across the link. In one example, a two-connector interconnect of 20" supporting a 16 GT/s bit rate (e.g., 500) can be provided that minimizes connector stub via effect, minimizes SPU socket effect, leverages improved, low-loss personal computer board (PCB) advancements, and provides an increase in on-chip receiver front end gain, among potentially other features, to realize positive gain across the link.

Figure 6:
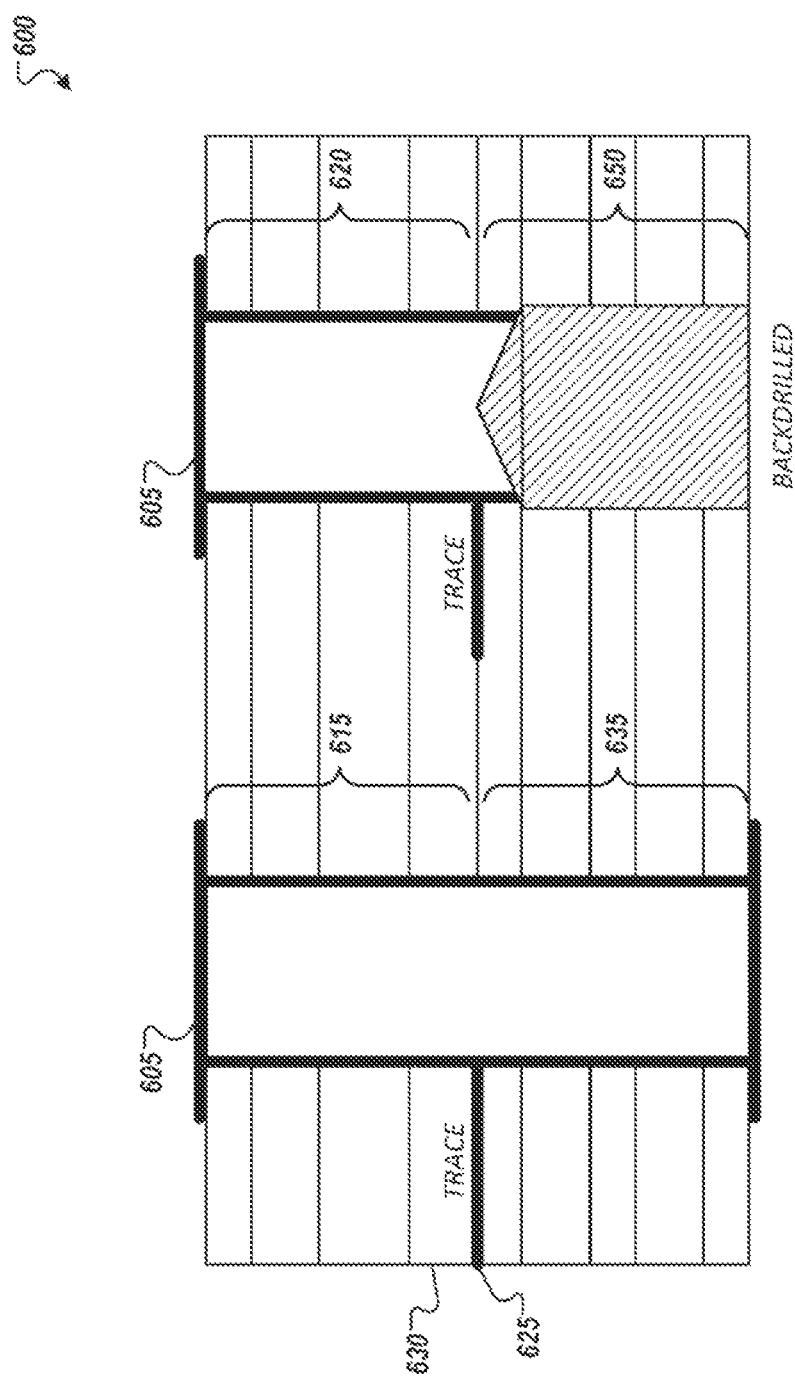
FIG. 6 is a simplified block diagram of a cross section of an interconnect structure including vias.

A connecter can include one or more vias that are used to make electrical connections between layers. Vias can be used, for instance, to carry signals or power between layers of a circuit board or component. In high speed systems, the portion of the via leftover on a connector, chip, or board, that is the portion not used within a point-to-point electrical link utilizing the via. Turning to FIG. 6, a simplified representation 600 of a cross section of a circuit board or other component is shown. The component can include one or more stub vias 605, 610. A via can make electrical connections between layers on a printed circuit board such as through plated through hole (PTH) technology. For instance, a via can connect the pins of connectors to inner signal layers (e.g., traces). For instance, in the example of FIG. 6, a portion of a link can be implemented using a portion (e.g., 615, 620) of a PTH via to connect one portion of the link to another (e.g., a trace (e.g., 625) that runs along a layer 630 of the component to another component, another via, etc. on the link (or channel)). The remaining portion (e.g., 635) of the via can be considered the stub. In high speed connections utilizing a via, a via stub 635 can cause resonance effects (e.g., resonant frequency nulls) that result in signal denigration for a channel (e.g., lane). Accordingly, in some implementations, via stubs can be backdrilled, such as shown at 650, to mitigate against such effects. Back-drilling can remove the stub portion of a via that is the source of these negative electromagnetic effects. In some cases, backdrilling can be implemented as a post-fabrication drilling process where the back-drilled hole is of larger diameter than the original plated through hole (PTH).

Vias stubs in the two connectors employed in a 20" 16 GT/s channel can be removed or minimized, for instance, through backdrilling, U-turn vias, and other solutions. In the case of backdrilling, the type of connector may be selected based on the connector type being a good candidate for backdrilling. For instance, some connectors may be mechanically compromised and fail were they to be back-drilled. Other connector types can be more appropriate, such as surface mount connectors.

In addition to improving the electrical quality of connectors through backdrilling, the electrical quality of CPU sockets can also be improved to allow 20" 16 GT/s channels on the socket. For instance, each pin of a CPU socket or other device corresponding to a 20" 16 GT/s channel lane that is connected and routed through a board using a via, can be backdrilled. The socket stub length of these longer, two-connector, high-speed channels can also be reduced by reserving layers closer to the pins for traces utilized by the channel. This can allow the socket stub length (of the via) to be bounded by routing these lanes through such layers of the board.

Minimizing CPU socket effect can involve designing the pinout and breakout layout of a board such that the lanes of 20" 16 GT/s channels are given layout priority. For instance, channels can be designed to be routed on layers such that backdrilling is available for every pin of the CPU connected to the 20" 16 GT/s channel. Alternatively (or additionally), routing can be designed such that 20" 16 GT/s channels utilize layers that allow the length of socket stubs to be constrained.

Figure 7:
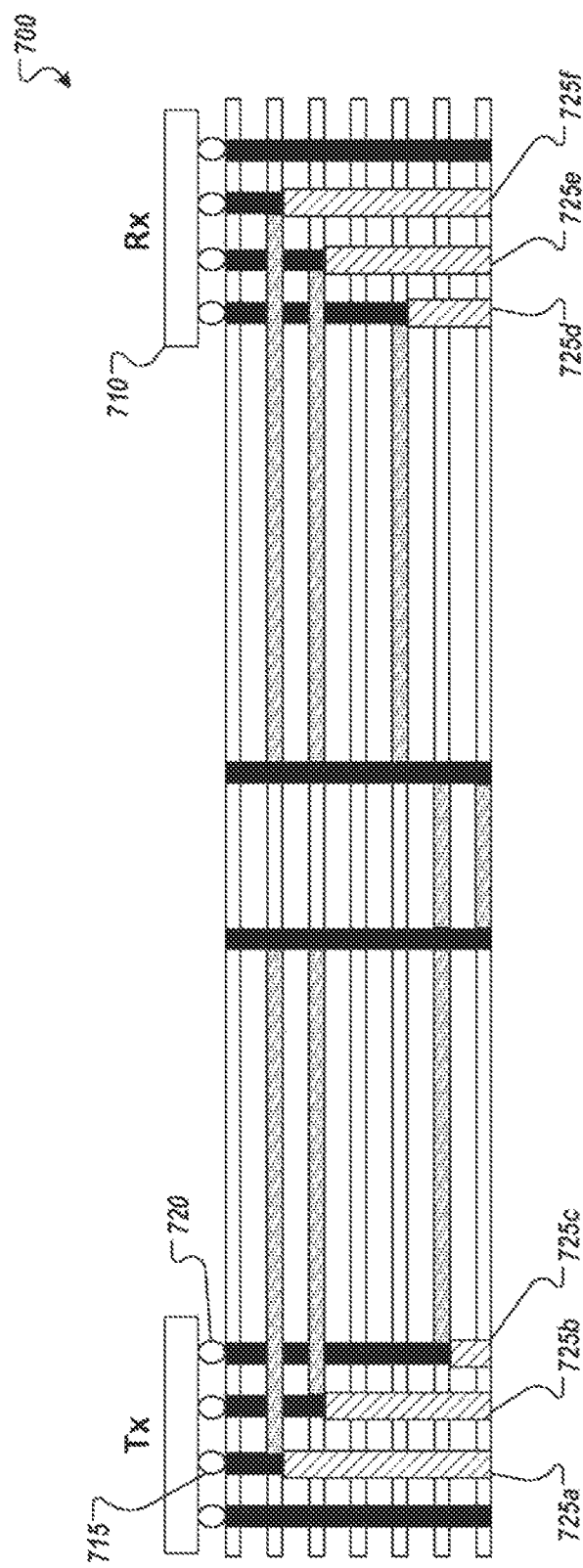
FIG. 7 is a representation of a cross section of an interconnect employing backdrilling of via stubs.

FIG. 7 is a simplified representation of a cross section of a board through which two devices 705, 710, are connected using an example two connector link (such as one embodying a 20" 16 GT/s channel). In this example, breakouts of pins of the devices 705, 710 can be designed such that backdrilling can be applied without blocking other breakout channels in the pinfield. For instance, inner pins (e.g., 715) can be designed to breakout on layers above the breakouts of outer pins (e.g., 720) routed on lower layers of the board. Further, pins can be designed to be placed such that any pin whose via stub is to be drilled out (e.g., a pin of a 20" 16 GT/s channel) is not positioned adjacent to a power via, as backdrilling (e.g., 725*a-f*) may risk perforating the power planes and shapes, potentially resulting in an inefficient power delivery network. In addition, ground pins can be placed based on the perforations that are to result on ground planes after backdrilling, among other rules and examples.

Additional features can be included on a 20" two connector channel to allow bit rates meeting or exceed 16 GT/s while still realizing positive gain across the link. For instance, a low loss PC board can be realized, such as a board with trace differential insertion loss of less than or substantially equal to 0.48 dB/in at 4 GHz.

In addition to mitigating against stub effects at the connectors and sockets of a two connector channel of 12", and providing the channel using a low loss board, 16 GT/s speeds on a channel of at least 20" can be realized, in some cases, by further providing for additional gain in the receiver front end and/or additional peaking in the continuous time linear equalizer (CTLE). In some examples, the receiver front end can include the combined analog circuits in the signal data path including, for instance, CTLE, AGC (automatic gain control), DFE (decision-feedback equalizer), and/or data sampler (also called slicer), among other potential examples. For example, in one implementation, adding a total of approximately 6 dB of gain (e.g., above the baseline for PCIe 4.0) at the receiver front end and/or CTLE can assist in realizing a 20" 16 GT/s channel. Realizing a modest amount of gain (e.g., approximately 6 dB) can be achieved with only a modest increase in power and circuit complexity, for instance, through the addition of a single gain stage, among other examples. Additionally, in some systems, gain can be tunable or otherwise configurable on the channel. For instance, the channel can be programmably tuned for applications where 16 GT/s speeds are utilized and the gain can be turned off for applications using lower speeds, among other examples.

Reliability, Availability, and Serviceability (RAS)

In some implementations, an interconnect architecture, such as PCIe, can include enhancements to Reliability, Availability, and Serviceability (RAS) in the system. While this concern can apply at all data rates, some architectures can apply particular encoding schemes in connection with higher data rates. For instance, PCIe 4.0 (as well as PCIe revision 3.0) employ the 128b/130b encoding scheme, for instance, for data rates in excess of 8 GT/s. In the 128b/130b scheme, a per-lane parity is provided per SKP (or "skip") Ordered Set (SKP OS) to identify which lane(s) in a link may have failed to perform predictive analysis and work with a reduced link width, if appropriate, among other examples. Lane parity can be an effective tool in identifying errors on particular lanes of a link, however, in some instances, when the link is predominantly idle (e.g., with logical idle framing tokens (IDLs) on the Link), an exposure can exist causing the detection ability provided through the parity bit to be undermined, as errors in the framing token (e.g., IDL) can result in a link recovery which eliminates the parity information up until that point. Additional blindspots can exist in the error detection mechanisms of traditional architectures that can cause errors to be under-assessed. For example, an interconnect architecture can underdetect or altogether fail to detect faulty lanes relating to detected framing token errors, among other shortcomings.

Figure 8:
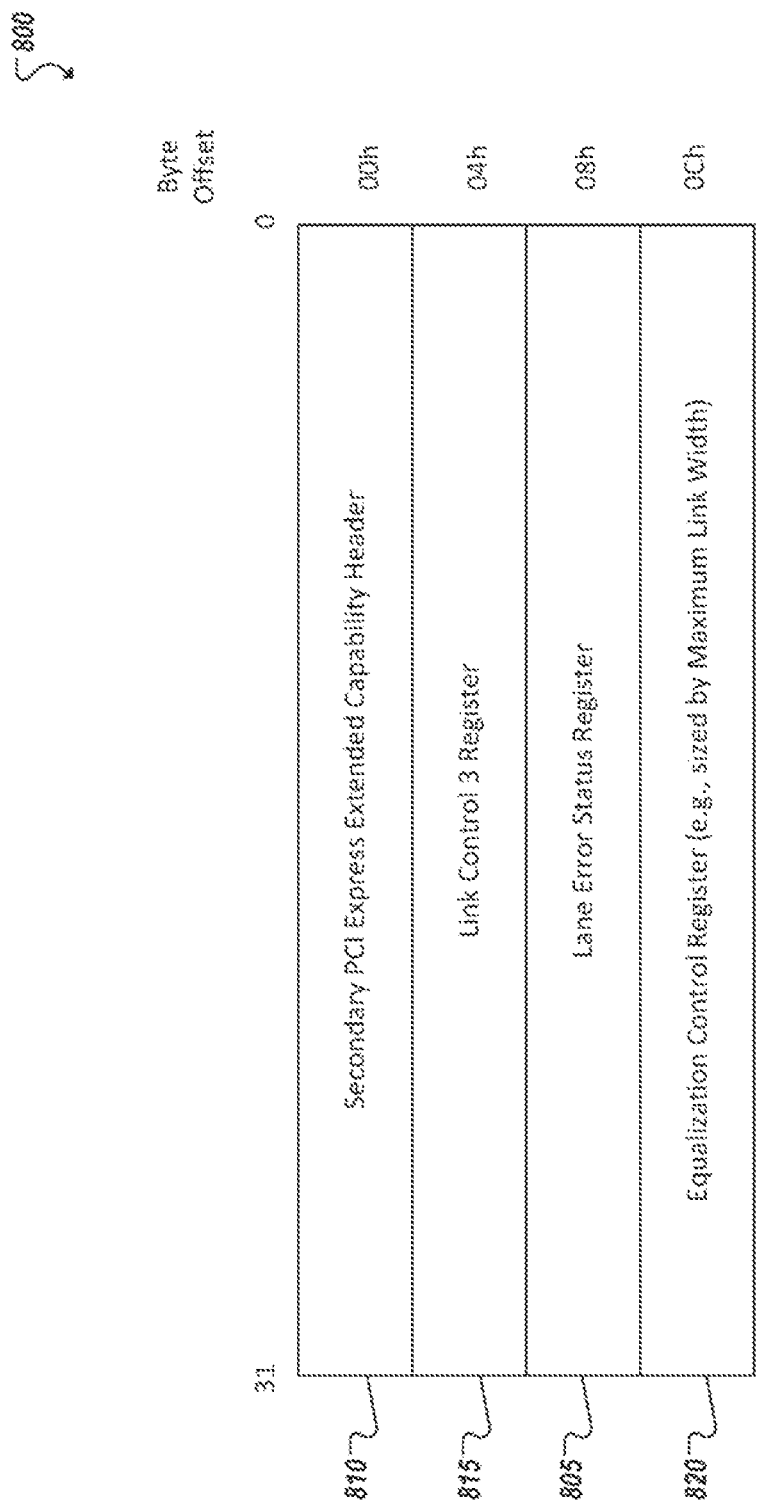
FIG. 8 is a block diagram representing a capability structure including a lane error status register.

In some architectures, a register can be provided to identify errors detected or anticipated on a link, as well as, in some cases, the particular lanes on which the errors appear. For example, as shown in FIG. 8, PCIe can provide a Lane Error Status (LES) register 805 in connection with a capability structure, such as the Secondary PCIe Extended Capability structure. Such a capability structure 800 can include a Secondary PCIe Extended Capability Header 810, Link Control 3 Register 815, and Equalization Control Register 820 in addition to LES register 805. In some implementations, the LES register can include a 32-bit vector, where each bit corresponds to a lane in the link e.g., (identified by the lane number) and indicates if the lane detected an error. A set of errors is defined in PCIe that can result in the reporting of an error event within the LES register. For example, as introduced above, data parity can be implemented through a data parity bit included in a SKP OS that indicates whether even parity was detected to exist in the payload of all data block transmitted after scrambling after the last SKP OS (or Start of Data Stream (SDS) Ordered Set), among other examples. The data parity but can be calculated for each lane independently. Receiver and transmitter devices calculate the parity using the same technique and the receiver compares its calculated parity for each lane with the parity calculated by the transmitter (as identified by the parity bit) to identify potential errors. For instance, if the calculated and received values do not match, the bit in the LES register (e.g., corresponding to the lane number where the mismatch was detected) can be set.

Figure 9:
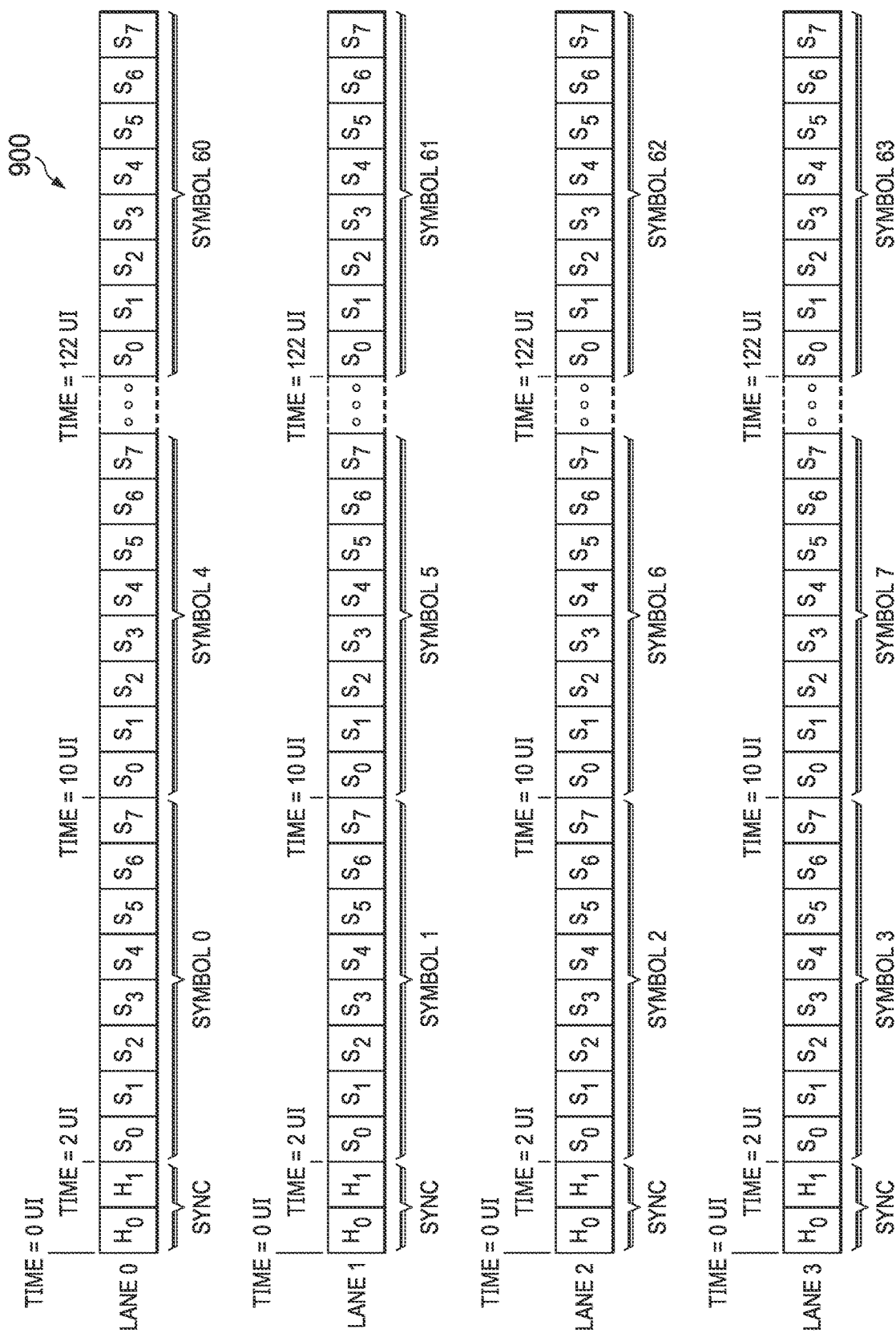
FIG. 9 is a simplified diagram illustrating data flows on a multi-lane interconnect.

As discussed above, and as illustrated in the simplified representation 900 of FIG. 9, data can be transmitted in two or more lanes of a link. For instance, as shown in the example PCIe, the basic entity of data transmission can be a symbol, such as a symbol implemented as an 8-bit data character. The payload of data blocks is a stream of symbols defined as a data stream that can include framing tokens, transaction layer packets (TLPs), data link layer packets (DLLPs), etc. Each symbol of the data stream can be placed on a single lane of the link for transmission, with the stream of symbols striped across all lanes of the link and spanning block boundaries. Further, in some instances, the physical layer can use a per-lane block code. Each block can include a two-bit sync header and the payload. In PCIe, two valid sync header encodings are defined: 10b and 01b, that define the type of payload the block contains. For instance, a synch header of 10b can indicate a data block and a synch header 01b can indicate an ordered set block. As an example, FIG. 9 shows the transmission of a data stream on four lanes, Lanes 0, 1, 2, and 3. All lanes of a multi-lane link transmit blocks with the same sync header simultaneously. The bit transmission order can begin with the sync header (represented as "H1H0", placed on the lane as "H0–H1") followed by a first symbol, represented as "S7-S6-S5-S4-S3-S2-S1-S0", placed on a lane starting with "S0" and ending with "S7".

PCIe provides an option for a receiver to report errors corresponding to mismatched or invalid sync headers in a data stream to the LES register. For instance, identifying that one or more of the lanes (e.g., during the first two UIs in a data stream) includes a sync header with an invalid value (e.g., 00b, 11b) can be identified as an error on the lane that can be reported to the LES register, among other examples.

Figure 10:
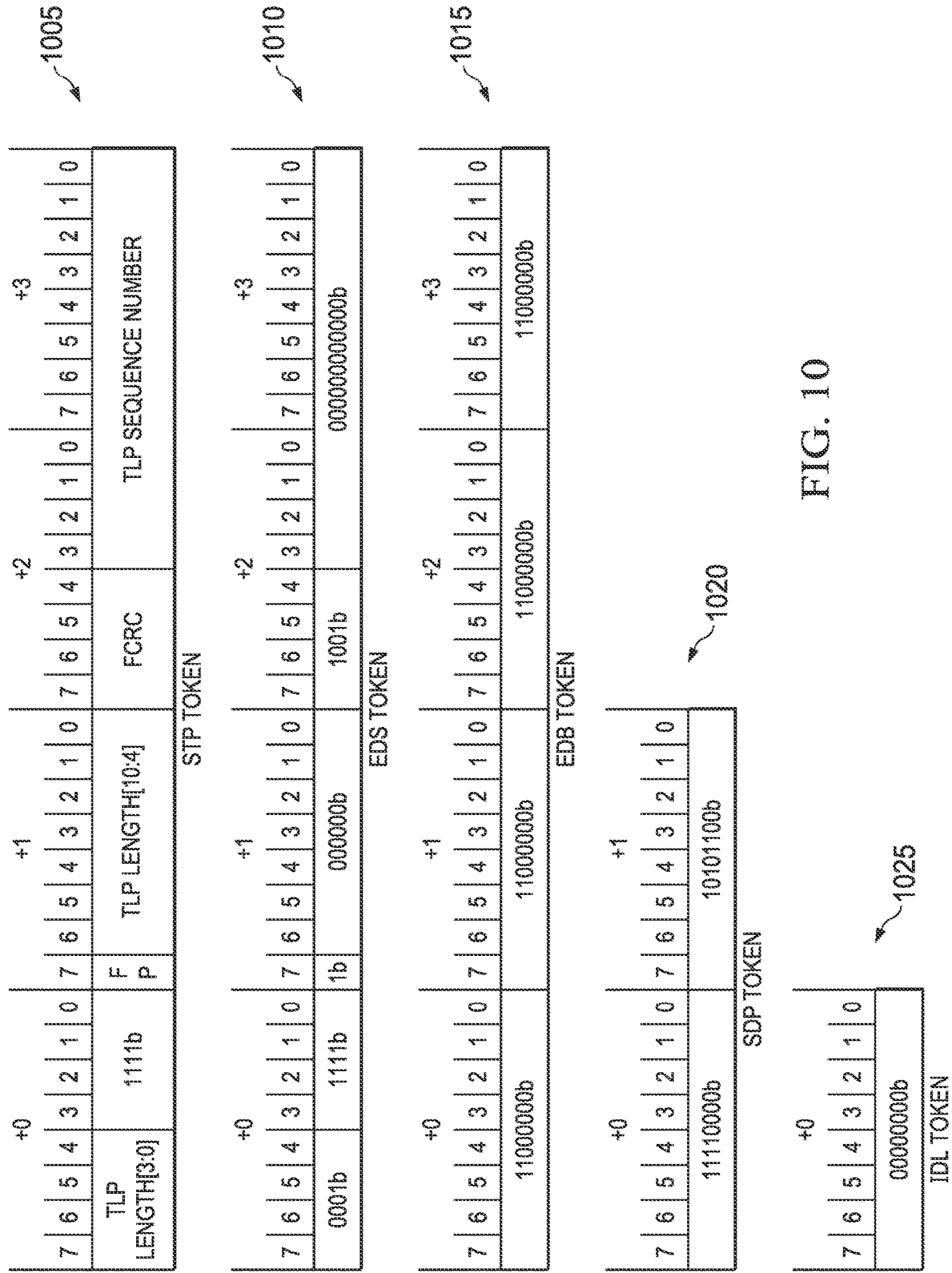
FIG. 10 shows representations of example framing token symbols.

Turning to FIG. 10, representations of example framings tokens 1005, 1010, 1015, 1020, 1025 are shown. A framing token (or "token") can be a physical layer data encapsulation that specifies or implies the number of symbols associated with the token and thereby identify the location of the next framing token. A framing token of a data stream can be located in the first symbol (Symbol 0) of the first lane (e.g., Lane 0) of the first data block of the data stream. In one example, PCIe defines five framing tokens, including start of TLP (STP) token 1005, end of data stream (EDS) token 1010, end bad (EDB) token 1015, start of DLLP (SDP) token 1020, and logical idle (IDL) token 1025. An STP token 1005 can be four (4) symbols long and followed by data link layer information. An example EDS token 1010 can be four (4) symbols long and indicate that the next block will be an ordered set block. An EDB token 1015 can also be four (4) symbols long and confirm that the TLP was "bad" and nullified. An EDB can always follow TLP data. Further, an SDP token 1020 can be shorter, at two (2) symbols in length, and can be followed by DLLP information. Finally, in this example, an IDL token 1025 can be a single symbol and transmitted when no TLPs, DLLPs, or other framing tokens are being transmitted on the link.

Figure 11:
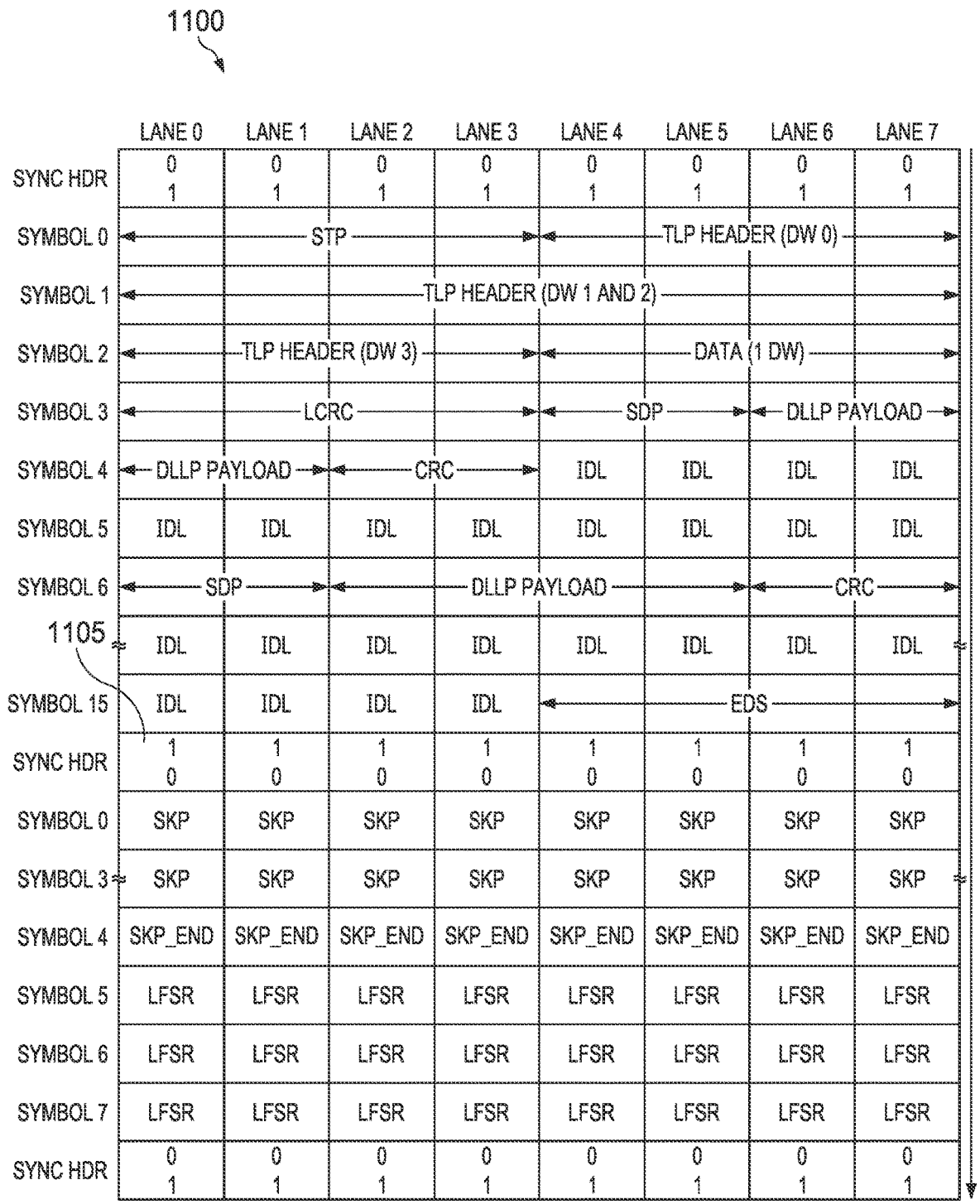
FIG. 11 is a simplified diagram illustrating data flows including an example skip (SKP) ordered set.

FIG. 11 illustrates a representation 1100, showing example data sent over an example x8 link illustrating features of a data stream defined according to a particular interconnect architecture, such as PCIe. In this example, the data can include the sending of an SKP ordered set. The stream, in this example, can commence with the sending of sync headers H1H0=10b, indicating a data block. Accordingly, a STP framing token can be sent as the first symbol 0 on Lanes 0-3 to indicate the start of a TLP stream. A link cyclic redundancy check (LCRC) can follow TLP data, further followed by an SDP header indicating that DLLP data is to be sent (e.g., at Symbols 3-4). Cyclic redundancy check (CRC) data can also be provided in connection with the DLLP data.

In the example of FIG. 11, logical idle (IDL) tokens are sent as no data is transmitted on the link for a series of UIs. An EDS token can then be sent to indicate a transition to ordered set data on the lanes. For instance, another sync header (e.g., at 1105) can be sent encoded as "01b" to indicate that the following data blocks will be ordered set data blocks. In this particular example, the ordered set that is sent is a SKP ordered set (OS). As noted above, in some implementations, a SKP OS can include a parity bit that indicates parity condition for each lane (e.g., Lanes 0-7) of the link. A SKP OS can further have a defined layout identifiable to the receiver. For instance, in the case of 128b/130b encoding in PCIe, a SKP OS can include a base of sixteen symbols. Groupings of four SKP symbols can be added or removed by a port, accordingly a SKP OS can be 8, 12, 16, 20, or 24 symbols, etc. Further, a SKP END symbol can be provided on the lanes, as illustrated in FIG. 11, to indicate the location of the end of the SKP OS and location of the next block sync header to transmitted on the lanes, among other examples.

In some example implementations, logic can be provided to detect additional lane errors in an interconnect architecture. Software in a system can monitor a register, such as the LES register, to track errors on a lane-by-lane basis over a period of time. A single lane error may not indicate that there is a problem with an error. However, as errors occur at a statistically significant frequency on one or more particular lanes of a link, system software can determine that a potential problem exists with regard to the particular lanes. Further, in some implementations, corrective measures can be taken to avoid transmitting at least some system data on an error-prone lane, such as by reconfiguring a link, generating a ticket for closer inspection of the link, among other examples. Some errors can be difficult to detect on a lane-by-lane basis. While some mechanisms have been provided to detect and report a portion of errors on a link (e.g., based on parity or incorrect sync headers), other architecture features and rules can be leveraged to identify still additional instances of lane specific rules. These errors can also be reported to a register for consideration along with traditional lane error reporting to construct a more complete picture of the health of the individual lanes of a link, among other examples and considerations.

In a first example, such as in the example of PCIe described above, if a lane receives an ordered set block with an invalid (mismatched, incorrect, or otherwise unexpected) EDS token immediately preceding it, an error can be presumed on the lane where the invalid EDS token was detected. Further, the error relating to the invalid EDS token on the lane can be reported to an error register, such as by setting a corresponding bit in a PCIe LES register.

In another example, a predetermined format for a particular ordered set can be leveraged to identify additional lane errors. For example, a SKP OS can include well-defined SKP symbols until SKP END symbols are transmitted to identify the end of the ordered set. If an invalid or erroneous SKP symbol is identified on a particular lane within the expected SKP symbols of the ordered set (and prior to the SKP END symbols), the identification of the erroneous SKP symbol can be used to trigger the reporting of an error for the particular lane within an error register, such as a LES register. Additionally, the defined timing of particular OS symbols can also be used to identify that an unexpected symbol has been received on a lane. For instance, continuing with the example of SKP ordered sets, as the number of symbols in a SKP OS is to be a multiple of four, not receiving the SKP END in symbol 8, 12, 16, 20, or 24 on one or more particular lanes of the link can cause a corresponding bit in the error register to be set for the particular lanes, among potentially other examples.

A variety of framing errors can occur and can be detected, in some implementations. For instance, when processing symbols that are expected to be a framing token, receiving a symbol or sequence of symbols that does not match the definition of a framing token can be a framing error. Additionally, some framing tokens can be defined to follow other types of data, and the unexpected arrival (or delay) of a particular framing token can be a framing error. As but one example, it can be specified that an EDB token be received immediately following a TLP, and receiving an EDB token at any other time (than immediately following a TLP) can trigger a framing error, among many other examples, such as framing errors defined in the specification of PCIe. While framing errors can be identified within a system, in some implementations, framing errors are not determined on a lane-by-lane basis or mapped to a particular lane of a link. Indeed, in some instances, a framing error can cause link recovery to be initiated, further complicating lane error detection when the link recovery wipes out a parity calculation and reporting (e.g., through a parity bit sent in a SKP OS), among other examples.

In some implementations, logic included in the logical PHY (e.g., at a receiver device) can further identify a failing lane from a framing token. In a first example, the symbols of a framing token can be specified (such as shown in the examples of FIG. 10) and detecting an error in one of the symbols deviating from the symbol value expected can be identified, as well as the lane on which the erroneous token symbol is identified. For instance, the first symbol of a framing token can be identified and if the first symbol does not the match the first symbol of any one of a set of defined framing tokens for the PHY, an error can be thrown. This error can be logged, for instance, in an LES register. In the example of PCIe framing tokens, if the first symbol of a received framing token does not match the first symbol defined for PCIe IDL, SDP, STP, EDB, or EDS, an error can be determined for the lane on which the erroneous first framing token symbol appears and the error can be logged in the lane error registry for the identified lane.

Second, in another example, IDL framing tokens, while only one symbol in length, can be specified to be transmitted on all lanes of a link when not transmitting a TLP, DLLP, or other framing token. Accordingly, when a first IDL appears on a lane of a link with four or more lanes, it can be expected that instances of the IDL will also appear on Lanes n+1, n+2, and n+3 (where the first Lane n (n modulo 4=0)). After transmitting an IDL token, the first symbol of the next STP or SDP token can be specified to be transmitted in Lane 0 of a future symbol time. Accordingly, given these constraints on the use and expected use of IDL tokens, if an IDL is not repeated as expected, or the first IDL appears in an incorrect lane, the lane on which the non-repeated IDL or otherwise erroneous symbol appeared can be identified, and also logged in an error register, such an LES register, as an error for the particular lane.

In yet another example, an EDB token can be defined to be a certain length, such as four symbols long in PCIe. Consequently, a framing error can result from identifying a first EDB symbol but then not identifying additional EDB symbols in the immediately subsequent symbols included in the defined length. For instance, in PCIe, where a framing token EDB is detected on Lane n (n modulo 4=0), immediately following a TLP, but not also detected on anyone of Lanes n+1, n+2, or n+3, an error can be reported to an error register for any lane (e.g., Lane n+1, n+2, or n+3) where an expected valid EDB symbol fails to appear. Additionally, a first symbol of an EDB token can be defined to be placed immediately following a TLP stream, meaning that the preceding framing token, an STP, was the last framing token to appear on the link. Accordingly, an error on Lane n can be identified and reported to an error register when a first symbol of an EDB token appears on Lane n, but the most recent prior framing token was something other than an STP token, among other examples.

Similar to the example of an EDB token framing error, framing errors can also be based on deviations from the length, format, and placement of other framing tokens. For instance, in another example, where a first symbol of an SDP is detected at Lane n, consistent with placement rules for valid SDP tokens (e.g., preceding DLLP traffic), but the Lane n+1 does not match the expected second symbol of the SDP token, logical PHY logic can identify an error on Lane n+1 and log the error in an error register.

Figure 12:
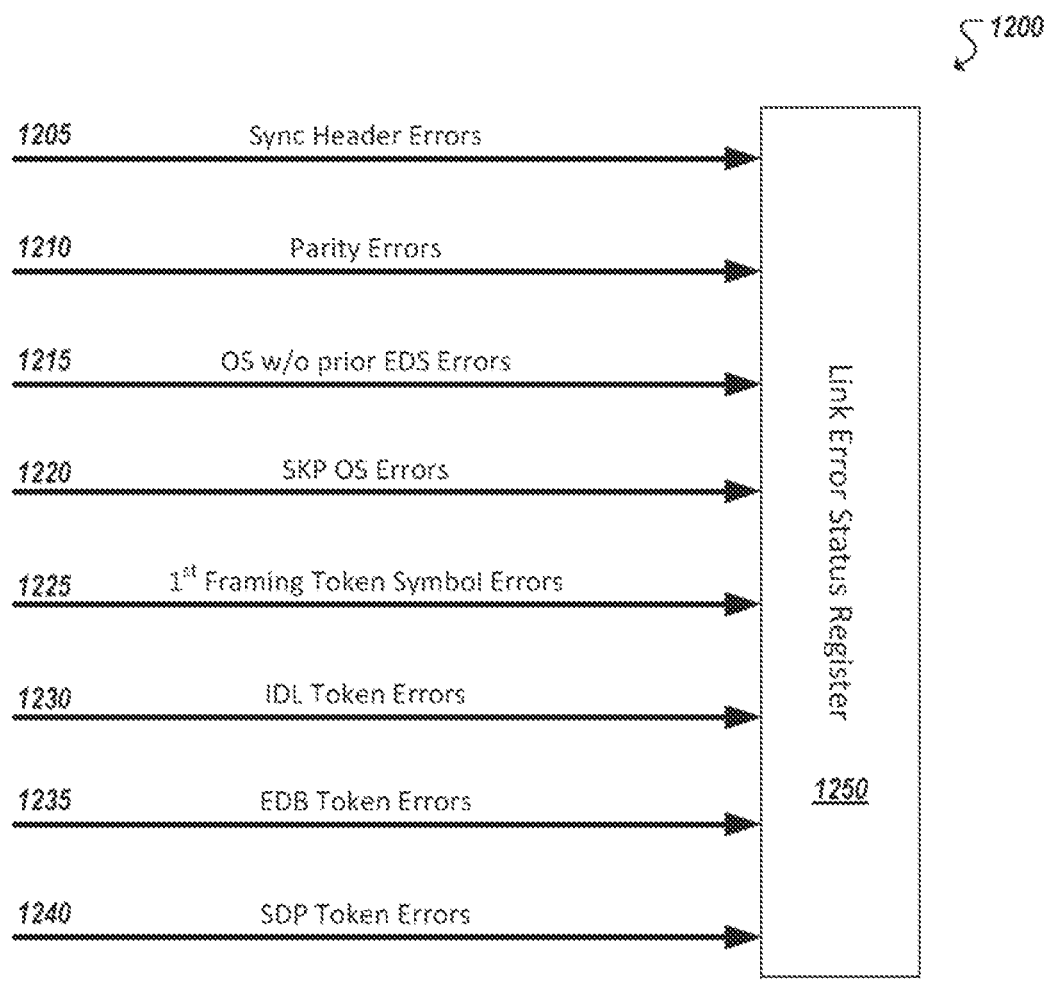
FIG. 12 is a simplified block diagram illustrating lane errors that can be reported to an error register.

FIG. 12 is a simplified block diagram illustrating expanded detection and logging of lane errors (e.g., 1205, 1210, 1215, 1220, 1225, 1230, 1235, 1240) in an example error register 1250, such a PCIe LES register, corresponding to the link. For instance, in addition to reporting sync header lane errors 1205, and parity bit errors 1210, additional errors that can be detected include ordered set lane errors, such as an OS block without prior EDS token error 1215 and a SKP OS error 1220 (such as described in the examples above). Further errors can be reported including, for instance, framing token lane errors such as first symbol framing token errors 1225, IDL framing token errors 1230 (e.g., pertaining to properly repeating the IDL after an initial IDL on a Lane n), EDB framing token errors 1235 (e.g., involving errors in the placement of EDB token symbols, as outlined, for instance, in the preceding discussion), and SDP framing token errors 1240 (e.g., involving a detected error in a second symbol of an SDP token), among potentially other examples leveraging rules defined for ordered sets, data blocks, and framing token within an architecture.

As noted above, in some cases errors or other events forcing a link recovery can undermine lane error detection mechanisms, such as parity determinations. As noted above, receiving and transmitting device can determine parity for a data stream or other stream and parity information determined by the transmitter can be communicated to the receiver for comparison of the received parity information with corresponding parity information (for the lane) as determined by the receiver for the same data stream. Parity information can be periodically sent. For instance, a SKP OS can be sent that includes one or more parity bits in SKP OS symbols that indicate parity determined for each lane by the transmitter. In some traditional systems, however, link recoveries or other events can result in parity information being erased and/or restarted prior to the previously determined parity information being communicated to the receiver. Accordingly, in such instances, errors determined for a particular lane based on the parity information can also be lost and remain unreported, undermining the accuracy of error reporting for the particular lane.

In one embodiment, parity information can be preserved by forcing a link recovery to be automatically preceded by a SKP OS, or other data set, that includes data reporting parity information for each lane in the link to be recovered. For instance, link recovery protocol can be redefined such that a SKP OS (including parity bits) is sent in response to a framing error or other event triggering a link recovery. The SKP OS can thereby carry the parity information determined by the transmitter up to the moment the link recovery was triggered, allowing the receiver to identify potential lane errors based on the parity information.

In one example, parity information can be sent pre-recovery by sending a SKP OS prior to a link leaving an active (e.g., L0) state to enter recovery. For instance, each transmitter can send a SKP OS (e.g., according to predefined intervals, such as a maximum interval between SKP OSes) followed by an additional data block with an EDS token prior to entering Recovery. This can ensure that the receiver receives the parity for the preceding data blocks it has received, including one or more data blocks that may have caused a framing error. The receiver can further log the error in the appropriate LES if the parity bit comparison indicates an error.

In another example, rather than prematurely dumping parity information prior to a recovery or other event (e.g., in an attempt to make sure the parity information is communicated before it is lost), parity information, such as SKP OS parity, can be extended to cover parity across the data streams while the link remains active (e.g., "LinkUp=1b" in PCIe). Further, parity information can also be maintained persistently for each lane of a link such that the parity information persists through a recovery event. Where traditional link recovery would cause parity information for a preceding data block (e.g., interrupted by the recovery) to be lost, persistently storing the parity information can allow the parity to be preserved through the recovery and communicated following the recovery (e.g., in the first SKP OS following the recovery). Additionally, in some cases, parity information for new data blocks sent following the recovery of the link (and prior to the next SKP OS) can also be determined, and in some cases added to the preserved pre-recovery parity information, and this combined parity information can be communicated, for instance, in the next SKP OS, among other examples.

It should be appreciated that the above examples are non-limiting examples and provided for purposes of illustrating certain principles and features only. Further, some systems can include various combinations of two or more of the features and components described above. As an example, a system can include combinations of the example error detection features described above, such as lane error detection functionality described above.

Turning to FIGS. 13A-13D, example flowcharts 1300a-d are shown illustrating example techniques for detecting errors on lanes of a link. For instance, in FIG. 13A, data can be received 1305 on a link including a plurality of lanes. The data can include symbols and the symbols can be monitored to determine 1310 whether one or more of the symbols is an erroneous symbol. An erroneous symbol can include symbols in a framing token (e.g., an EDB, EDS, STP, IDL, SDP, etc.), ordered set (e.g., SKP OS, etc.), or other defined sequence that have an incorrect value, are in an incorrect or unexpected order, transmitted on an incorrect or unexpected lane, do not belong in a particular defined sequence, among other examples. The lane on which the erroneous symbol was sent can be identified 1315 and a lane error for the identified lane can be reported 1320, for instance, in a lane error register, based on the erroneous symbol, among other examples.

Turning to FIG. 13B, data can be transmitted 1325 on a link including multiple lanes. Parity information can be maintained 1330 for each lane on the link. In response to identifying 1335 that the link is to exit an active state (such as in connection with a recovery of the link), an indication of the parity information can be sent 1340 prior to the exit from the active link state. In one example, the indication of the parity information can be included in parity bits of an ordered set, such as a PCIe SKP ordered set, sent to a recipient. The indication of the parity information can be used (e.g., by the recipient of the particular information) to compare the parity information with parity information received by the recipient. Mismatches in the parity information can be identified as evidence of a lane error involving a lane corresponding to the mismatched parity information.

Figures 13C, 13D:
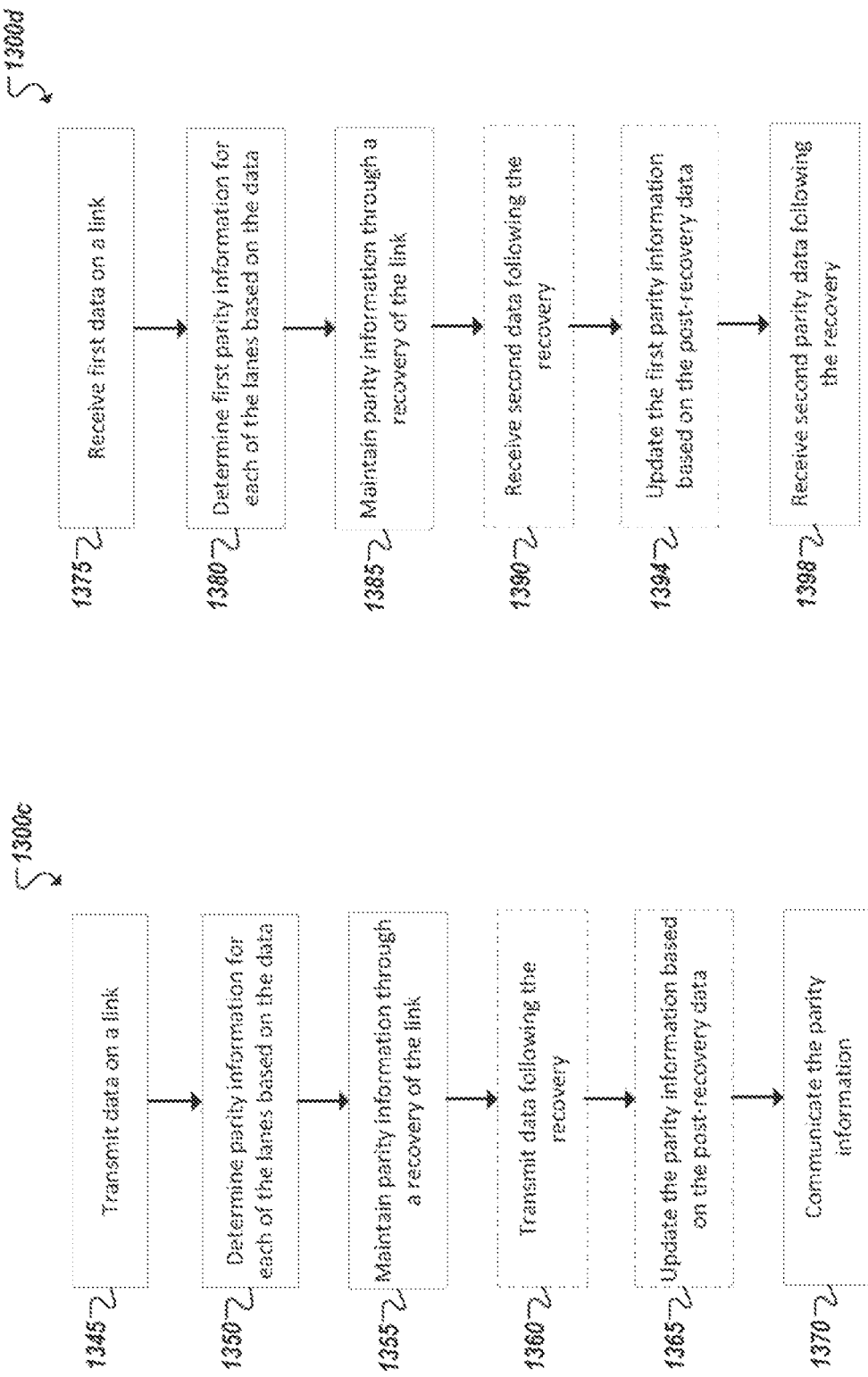

In the example of FIG. 13C, data can be transmitted 1345 on lanes of a link and parity information can be determined 1350 for each of the lanes based on the transmitted data identified on each lane. Recovery of the link can occur and the parity information can be maintained 1355 through the recovery. Following the recovery, an indication of the parity information for each lane can be communicated 1370 and this indication can be based on the parity information maintained through the link recovery. Optionally, additional data can be transmitted 1360 on the link following the link recovery and parity information can be determined for each lane based on this post-recovery data. The parity information for each lane can be updated 1365 based on both the pre- and post-recovery data on each lane and the indication of parity information that is communicated 1370 can indicate this combined parity information.

Corresponding to the example of FIG. 13C, in FIG. 13D, first data can be received 1375 on a link and first parity information can be determined 1380 for each lane based on the data received on the lanes. This parity information can be maintained 1385 through a recovery of the link following the receipt of the first data. Second parity data can be received 1398 following the recovery of the link, such as identified in parity bits of a received SKP ordered set. This second parity data can be compared with parity information maintained through (and beyond) the link recovery. In some cases, the maintained parity information can be updated 1394 to account for parity information determined for the lanes based on second data received 1390 on the lanes following the link recovery (e.g., commensurate with the updating of the parity information by the corresponding transmitter based on the transmission of this post-recovery data), among other examples.

It should be noted that while much of the above principles and examples are described within the context of PCIe and particular revisions of the PCIe specification, the principles, solutions, and features described herein can be equally applicable to other protocols and systems. For instance, analogous lane errors can be detected in other links using other protocols based on analogous symbols, data streams, and tokens, as well as rules specified for the use, placement, and formatting of such structures within data transmitted over these other links. Further, alternative mechanisms and structures (e.g., beside a PCIe LES register or SKP OS) can be used to provide lane error detection and reporting functionality within a system. Moreover, combinations of the above solutions can be applied within systems, including combinations of logical and physical enhancements to a link and its corresponding logic as described herein, among other examples.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 14:
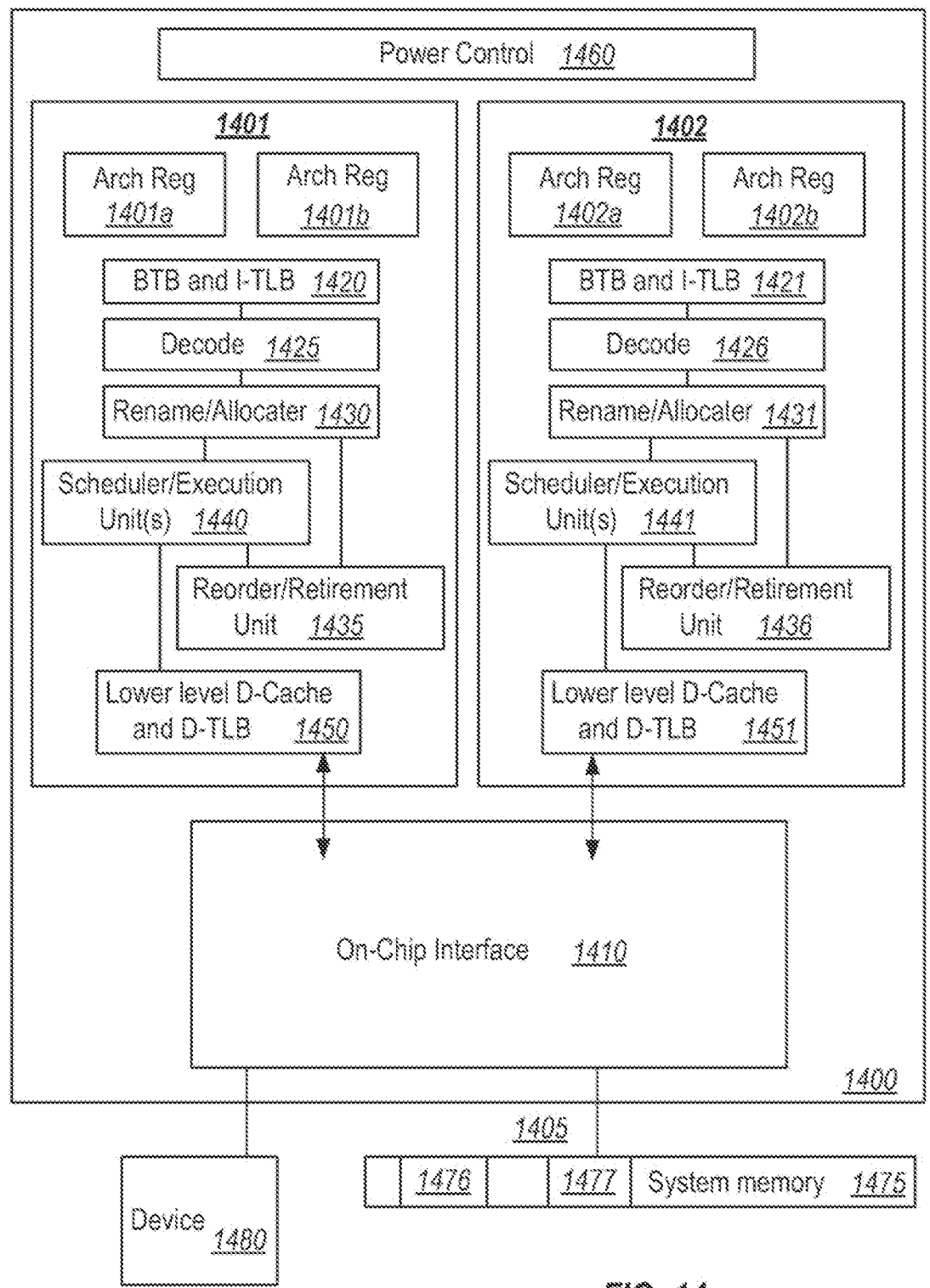
FIG. 14 illustrates an embodiment of a block diagram for a computing system including a multicore processor.

Referring to FIG. 14, an embodiment of a block diagram for a computing system including a multicore processor is depicted. Processor 1400 includes any processor or processing device, such as a microprocessor, an embedded processor, a digital signal processor (DSP), a network processor, a handheld processor, an application processor, a co-processor, a system on a chip (SOC), or other device to execute code. Processor 1400, in one embodiment, includes at least two cores—core 1401 and 1402, which may include asymmetric cores or symmetric cores (the illustrated embodiment). However, processor 1400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1400, as illustrated in FIG. 14, includes two cores—core 1401 and 1402. Here, core 1401 and 1402 are considered symmetric cores, i.e. cores with the same configurations, functional units, and/or logic. In another embodiment, core 1401 includes an out-of-order processor core, while core 1402 includes an in-order processor core. However, cores 1401 and 1402 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1401 are described in further detail below, as the units in core 1402 operate in a similar manner in the depicted embodiment.

As depicted, core 1401 includes two hardware threads 1401*a* and 1401*b*, which may also be referred to as hardware thread slots 1401*a* and 1401*b*. Therefore, software entities, such as an operating system, in one embodiment potentially view processor 1400 as four separate processors, i.e., four logical processors or processing elements capable of executing four software threads concurrently. As alluded to above, a first thread is associated with architecture state registers 1401*a*, a second thread is associated with architecture state registers 1401*b*, a third thread may be associated with architecture state registers 1402*a*, and a fourth thread may be associated with architecture state registers 1402*b*. Here, each of the architecture state registers (1401*a*, 1401*b*, 1402*a*, and 1402*b*) may be referred to as processing elements, thread slots, or thread units, as described above. As illustrated, architecture state registers 1401*a* are replicated in architecture state registers 1401*b*, so individual architecture states/contexts are capable of being stored for logical processor 1401*a* and logical processor 1401*b*. In core 1401, other smaller resources, such as instruction pointers and renaming logic in allocator and renamer block 1430 may also be replicated for threads 1401*a* and 1401*b*. Some resources, such as re-order buffers in reorder/retirement unit 1435, ILTB 1420, load/store buffers, and queues may be shared through partitioning. Other resources, such as general purpose internal registers, page-table base register(s), low-level data-cache and data-TLB 1415, execution unit(s) 1440, and portions of out-of-order unit 1435 are potentially fully shared.

Processor 1400 often includes other resources, which may be fully shared, shared through partitioning, or dedicated by/to processing elements. In FIG. 14, an embodiment of a purely exemplary processor with illustrative logical units/resources of a processor is illustrated. Note that a processor may include, or omit, any of these functional units, as well as include any other known functional units, logic, or firmware not depicted. As illustrated, core 1401 includes a simplified, representative out-of-order (OOO) processor core. But an in-order processor may be utilized in different embodiments. The OOO core includes a branch target buffer 1420 to predict branches to be executed/taken and an instruction-translation buffer (I-TLB) 1420 to store address translation entries for instructions.

Core 1401 further includes decode module 1425 coupled to fetch unit 1420 to decode fetched elements. Fetch logic, in one embodiment, includes individual sequencers associated with thread slots 1401*a*, 1401*b*, respectively. Usually core 1401 is associated with a first ISA, which defines/specifies instructions executable on processor 1400. Often machine code instructions that are part of the first ISA include a portion of the instruction (referred to as an opcode), which references/specifies an instruction or operation to be performed. Decode logic 1425 includes circuitry that recognizes these instructions from their opcodes and passes the decoded instructions on in the pipeline for processing as defined by the first ISA. For example, as discussed in more detail below decoders 1425, in one embodiment, include logic designed or adapted to recognize specific instructions, such as transactional instruction. As a result of the recognition by decoders 1425, the architecture or core 1401 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1426, in one embodiment, recognize the same ISA (or a subset thereof). Alternatively, in a heterogeneous core environment, decoders 1426 recognize a second ISA (either a subset of the first ISA or a distinct ISA).

In one example, allocator and renamer block 1430 includes an allocator to reserve resources, such as register files to store instruction processing results. However, threads 1401*a* and 1401*b* are potentially capable of out-of-order execution, where allocator and renamer block 1430 also reserves other resources, such as reorder buffers to track instruction results. Unit 1430 may also include a register renamer to rename program/instruction reference registers to other registers internal to processor 1400. Reorder/retirement unit 1435 includes components, such as the reorder buffers mentioned above, load buffers, and store buffers, to support out-of-order execution and later in-order retirement of instructions executed out-of-order.

Scheduler and execution unit(s) block 1440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1450 are coupled to execution unit(s) 1440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1401 and 1402 share access to higher-level or further-out cache, such as a second level cache associated with on-chip interface 1410. Note that higher-level or further-out refers to cache levels increasing or getting further way from the execution unit(s). In one embodiment, higher-level cache is a last-level data cache—last cache in the memory hierarchy on processor 1400—such as a second or third level data cache. However, higher level cache is not so limited, as it may be associated with or include an instruction cache. A trace cache—a type of instruction cache—instead may be coupled after decoder 1425 to store recently decoded traces. Here, an instruction potentially refers to a macro-instruction (i.e. a general instruction recognized by the decoders), which may decode into a number of micro-instructions (micro-operations).

In the depicted configuration, processor 1400 also includes on-chip interface module 1410. Historically, a memory controller, which is described in more detail below, has been included in a computing system external to processor 1400. In this scenario, on-chip interface 1410 is to communicate with devices external to processor 1400, such as system memory 1475, a chipset (often including a memory controller hub to connect to memory 1475 and an I/O controller hub to connect peripheral devices), a memory controller hub, a northbridge, or other integrated circuit. And in this scenario, bus 1405 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1475 may be dedicated to processor 1400 or shared with other devices in a system. Common examples of types of memory 1475 include DRAM, SRAM, non-volatile memory (NV memory), and other known storage devices. Note that device 1480 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1400. For example in one embodiment, a memory controller hub is on the same package and/or die with processor 1400. Here, a portion of the core (an on-core portion) 1410 includes one or more controller(s) for interfacing with other devices such as memory 1475 or a graphics device 1480. The configuration including an interconnect and controllers for interfacing with such devices is often referred to as an on-core (or un-core configuration). As an example, on-chip interface 1410 includes a ring interconnect for on-chip communication and a high-speed serial point-to-point link 1405 for off-chip communication. Yet, in the SOC environment, even more devices, such as the network interface, co-processors, memory 1475, graphics processor 1480, and any other known computer devices/interface may be integrated on a single die or integrated circuit to provide small form factor with high functionality and low power consumption.

In one embodiment, processor 1400 is capable of executing a compiler, optimization, and/or translator code 1477 to compile, translate, and/or optimize application code 1476 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 15:
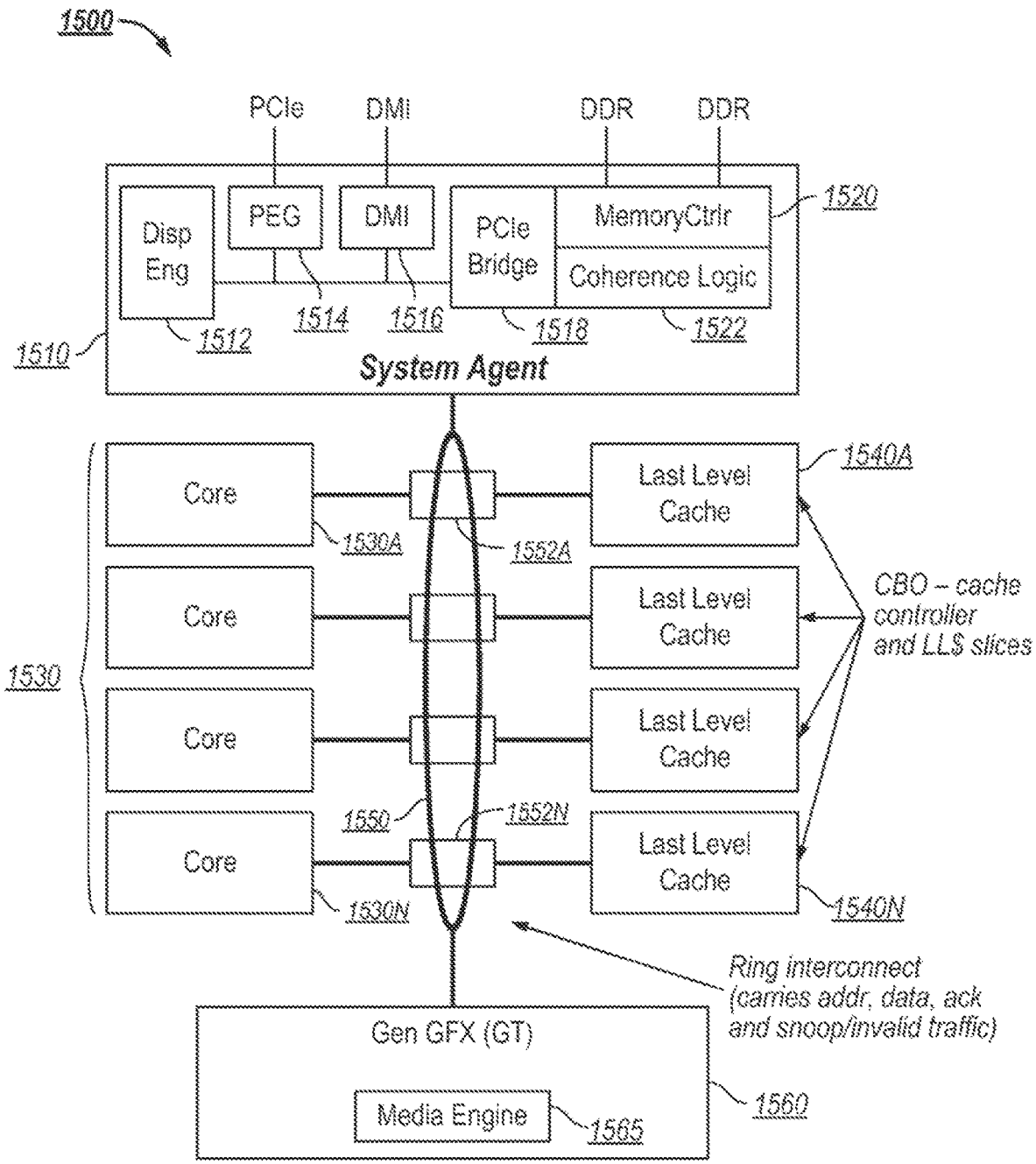
FIG. 15 illustrates another embodiment of a block diagram for a computing system including a multicore processor.

Referring now to FIG. 15, shown is a block diagram of an embodiment of a multicore processor. As shown in the embodiment of FIG. 15, processor 1500 includes multiple domains. Specifically, a core domain 1530 includes a plurality of cores 1530A-1530N, a graphics domain 1560 includes one or more graphics engines having a media engine 1565, and a system agent domain 1510.

In various embodiments, system agent domain 1510 handles power control events and power management, such that individual units of domains 1530 and 1560 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 1530 and 1560 may operate at different voltage and/or power, and furthermore the individual units within the domains each potentially operate at an independent frequency and voltage. Note that while only shown with three domains, understand the scope of the present invention is not limited in this regard and additional domains may be present in other embodiments.

As shown, each core 1530 further includes low level caches in addition to various execution units and additional processing elements. Here, the various cores are coupled to each other and to a shared cache memory that is formed of a plurality of units or slices of a last level cache (LLC) 1540A-1540N; these LLCs often include storage and cache controller functionality and are shared amongst the cores, as well as potentially among the graphics engine too.

As seen, a ring interconnect 1550 couples the cores together, and provides interconnection between the core domain 1530, graphics domain 1560 and system agent circuitry 1510, via a plurality of ring stops 1552A-1552N, each at a coupling between a core and LLC slice. As seen in FIG. 15, interconnect 1550 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, On-chip System Fabric (OSF), an Advanced Microcontroller Bus Architecture (AMBA) interconnect, a multi-dimensional mesh fabric, or other known interconnect architecture) may be utilized in a similar fashion.

As further depicted, system agent domain 1510 includes display engine 1512 which is to provide control of and an interface to an associated display. System agent domain 1510 may include other units, such as: an integrated memory controller 1520 that provides for an interface to a system memory (e.g., a DRAM implemented with multiple DIMMs; coherence logic 1522 to perform memory coherence operations. Multiple interfaces may be present to enable interconnection between the processor and other circuitry. For example, in one embodiment at least one direct media interface (DMI) 1516 interface is provided as well as one or more PCIe™ interfaces 1514. The display engine and these interfaces typically couple to memory via a PCIe™ bridge 1518. Still further, to provide for communications between other agents, such as additional processors or other circuitry, one or more other interfaces may be provided.

Figure 16:
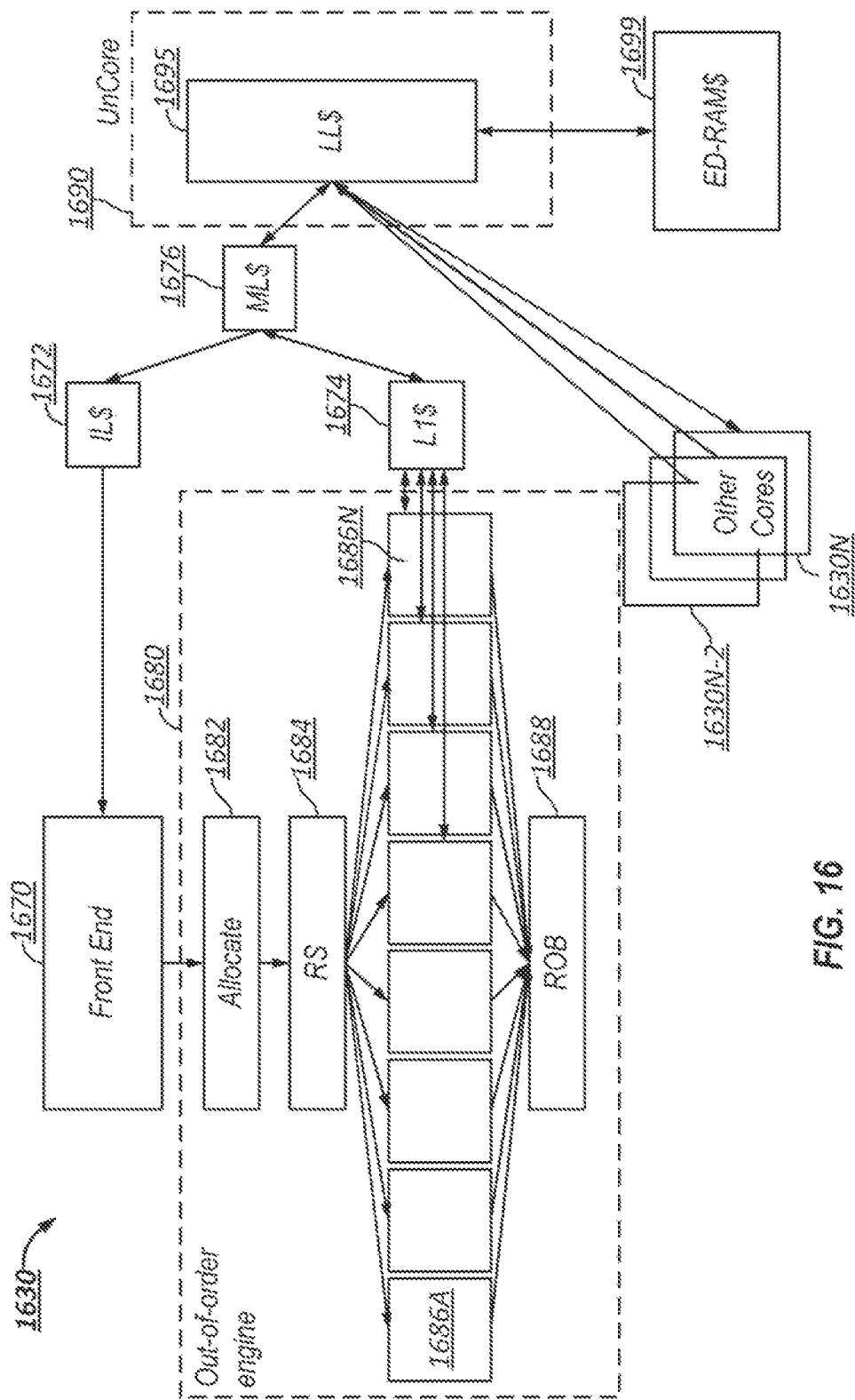
FIG. 16 illustrates an embodiment of a block diagram for a processor.

Referring now to FIG. 16, shown is a block diagram of a representative core; specifically, logical blocks of a back-end of a core, such as core 1530 from FIG. 15. In general, the structure shown in FIG. 16 includes an out-of-order processor that has a front end unit 1670 used to fetch incoming instructions, perform various processing (e.g. caching, decoding, branch predicting, etc.) and passing instructions/operations along to an out-of-order (OOO) engine 1680. OOO engine 1680 performs further processing on decoded instructions.

Specifically in the embodiment of FIG. 16, out-of-order engine 1680 includes an allocate unit 1682 to receive decoded instructions, which may be in the form of one or more micro-instructions or uops, from front end unit 1670, and allocate them to appropriate resources such as registers and so forth. Next, the instructions are provided to a reservation station 1684, which reserves resources and schedules them for execution on one of a plurality of execution units 1686A-1686N. Various types of execution units may be present, including, for example, arithmetic logic units (ALUs), load and store units, vector processing units (VPUs), floating point execution units, among others. Results from these different execution units are provided to a reorder buffer (ROB) 1688, which take unordered results and return them to correct program order.

Still referring to FIG. 16, note that both front end unit 1670 and out-of-order engine 1680 are coupled to different levels of a memory hierarchy. Specifically shown is an instruction level cache 1672, that in turn couples to a mid-level cache 1676, that in turn couples to a last level cache 1695. In one embodiment, last level cache 1695 is implemented in an on-chip (sometimes referred to as uncore) unit 1690. As an example, unit 1690 is similar to system agent 1510 of FIG. 15. As discussed above, uncore 1690 communicates with system memory 1699, which, in the illustrated embodiment, is implemented via ED RAM. Note also that the various execution units 1686 within out-of-order engine 1680 are in communication with a first level cache 1674 that also is in communication with mid-level cache 1676. Note also that additional cores 1630N-2-1630N can couple to LLC 1695. Although shown at this high level in the embodiment of FIG. 16, understand that various alterations and additional components may be present.

Figure 17:
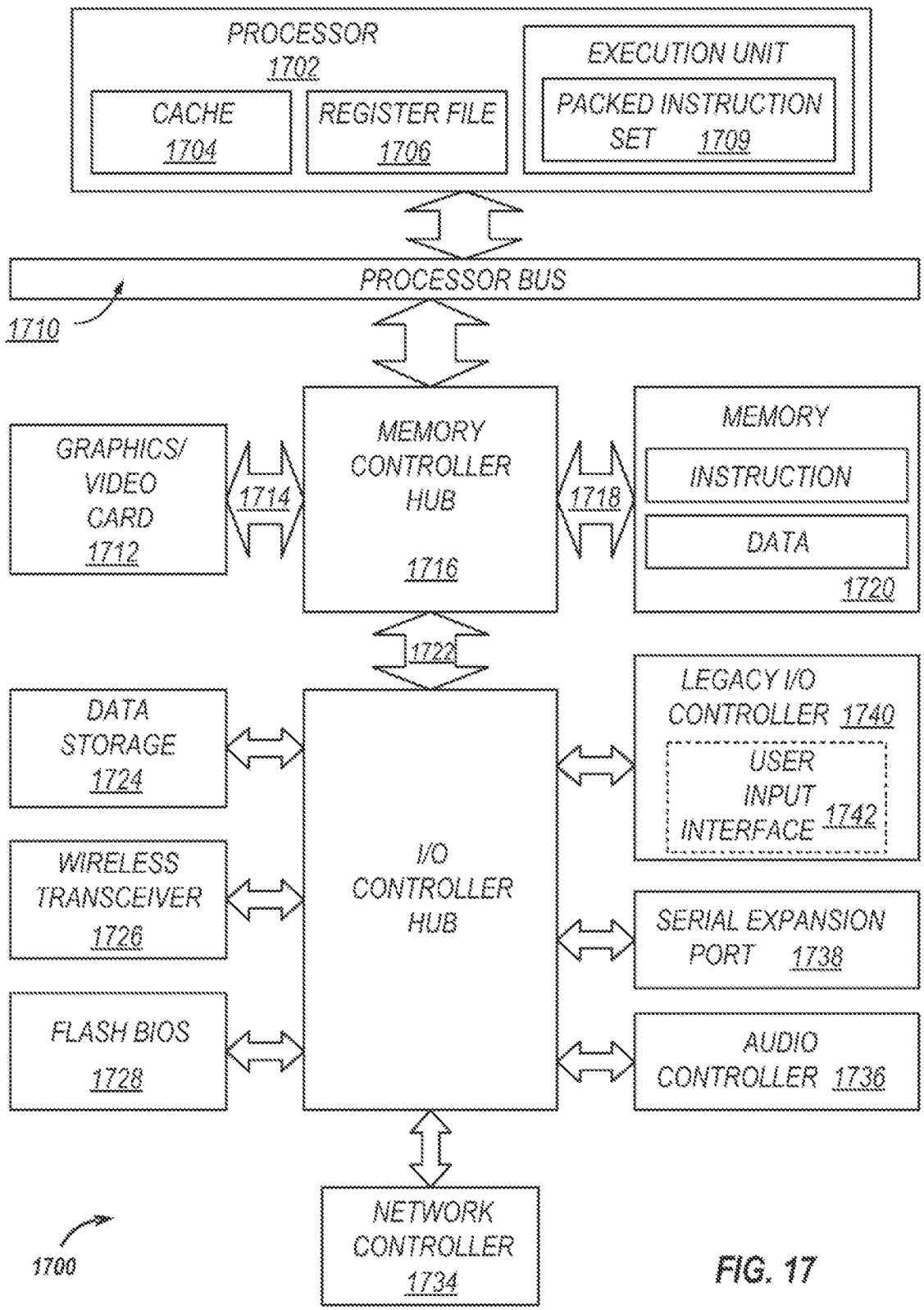
FIG. 17 illustrates another embodiment of a block diagram for a computing system including a processor.

Turning to FIG. 17, a block diagram of an exemplary computer system formed with a processor that includes execution units to execute an instruction, where one or more of the interconnects implement one or more features in accordance with one embodiment of the present invention is illustrated. System 1700 includes a component, such as a processor 1702 to employ execution units including logic to perform algorithms for process data, in accordance with the present invention, such as in the embodiment described herein. System 1700 is representative of processing systems based on the PENTIUM III™, PENTIUM 4™, Xeon™, Itanium, XScale™ and/or StrongARM™ microprocessors, although other systems (including PCs having other microprocessors, engineering workstations, set-top boxes and the like) may also be used. In one embodiment, sample system 1700 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1702 includes one or more execution units 1708 to implement an algorithm that is to perform at least one instruction. One embodiment may be described in the context of a single processor desktop or server system, but alternative embodiments may be included in a multiprocessor system. System 1700 is an example of a 'hub' system architecture. The computer system 1700 includes a processor 1702 to process data signals. The processor 1702, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1702 is coupled to a processor bus 1710 that transmits data signals between the processor 1702 and other components in the system 1700. The elements of system 1700 (e.g. graphics accelerator 1712, memory controller hub 1716, memory 1720, I/O controller hub 1724, wireless transceiver 1726, Flash BIOS 1728, Network controller 1734, Audio controller 1736, Serial expansion port 1738, I/O controller 1740, etc.) perform their conventional functions that are well known to those familiar with the art.

In one embodiment, the processor 1702 includes a Level 1 (L1) internal cache memory 1704. Depending on the architecture, the processor 1702 may have a single internal cache or multiple levels of internal caches. Other embodiments include a combination of both internal and external caches depending on the particular implementation and needs. Register file 1706 is to store different types of data in various registers including integer registers, floating point registers, vector registers, banked registers, shadow registers, checkpoint registers, status registers, and instruction pointer register.

Execution unit 1708, including logic to perform integer and floating point operations, also resides in the processor 1702. The processor 1702, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1702. For one embodiment, execution unit 1708 includes logic to handle a packed instruction set 1709. By including the packed instruction set 1709 in the instruction set of a general-purpose processor 1702, along with associated circuitry to execute the instructions, the operations used by many multimedia applications may be performed using packed data in a general-purpose processor 1702. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1708 may also be used in micro controllers, embedded processors, graphics devices, DSPs, and other types of logic circuits. System 1700 includes a memory 1720. Memory 1720 includes a dynamic random access memory (DRAM) device, a static random access memory (SRAM) device, flash memory device, or other memory device. Memory 1720 stores instructions and/or data represented by data signals that are to be executed by the processor 1702.

Note that any of the aforementioned features or aspects of the invention may be utilized on one or more interconnect illustrated in FIG. 17. For example, an on-die interconnect (ODI), which is not shown, for coupling internal units of processor 1702 implements one or more aspects of the invention described above. Or the invention is associated with a processor bus 1710 (e.g. other known high performance computing interconnect), a high bandwidth memory path 1718 to memory 1720, a point-to-point link to graphics accelerator 1712 (e.g. a Peripheral Component Interconnect express (PCIe) compliant fabric), a controller hub interconnect 1722, an I/O or other interconnect (e.g. USB, PCI, PCIe) for coupling the other illustrated components. Some examples of such components include the audio controller 1736, firmware hub (flash BIOS) 1728, wireless transceiver 1726, data storage 1724, legacy I/O controller 1710 containing user input and keyboard interfaces 1742, a serial expansion port 1738 such as Universal Serial Bus (USB), and a network controller 1734. The data storage device 1724 can comprise a hard disk drive, a floppy disk drive, a CD-ROM device, a flash memory device, or other mass storage device.

Figure 18:
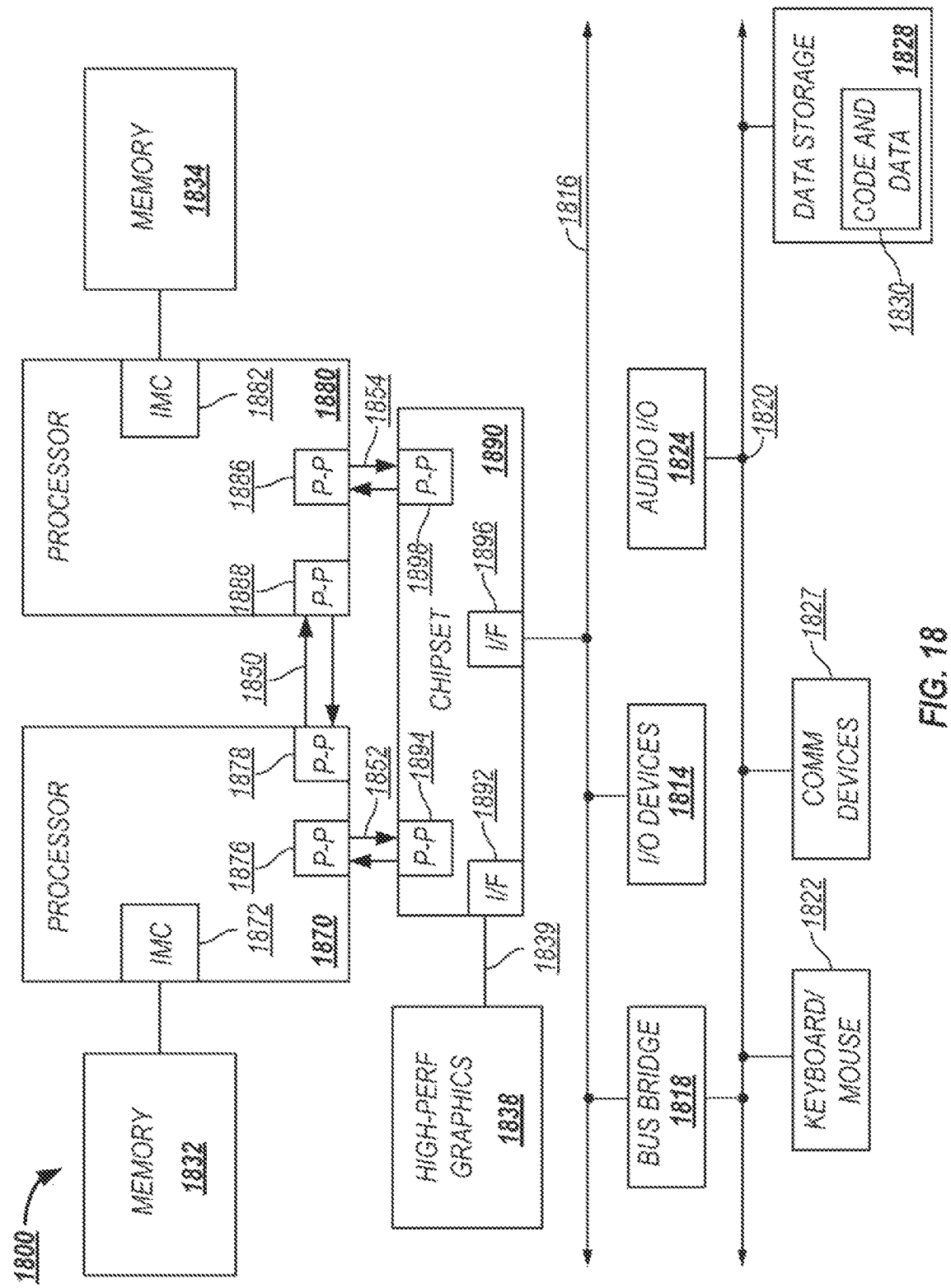
FIG. 18 illustrates an embodiment of a block for a computing system including multiple processors.

Referring now to FIG. 18, shown is a block diagram of a second system 1800 in accordance with an embodiment of the present invention. As shown in FIG. 18, multiprocessor system 1800 is a point-to-point interconnect system, and includes a first processor 1870 and a second processor 1880 coupled via a point-to-point interconnect 1850. Each of processors 1870 and 1880 may be some version of a processor. In one embodiment, 1852 and 1854 are part of a serial, point-to-point coherent interconnect fabric, such as a high-performance architecture. As a result, the invention may be implemented within the QPI architecture.

While shown with only two processors 1870, 1880, it is to be understood that the scope of the present invention is not so limited. In other embodiments, one or more additional processors may be present in a given processor.

Processors 1870 and 1880 are shown including integrated memory controller units 1872 and 1882, respectively. Processor 1870 also includes as part of its bus controller units point-to-point (P-P) interfaces 1876 and 1878; similarly, second processor 1880 includes P-P interfaces 1886 and 1888. Processors 1870, 1880 may exchange information via a point-to-point (P-P) interface 1850 using P-P interface circuits 1878, 1888. As shown in FIG. 18, IMCs 1872 and 1882 couple the processors to respective memories, namely a memory 1832 and a memory 1834, which may be portions of main memory locally attached to the respective processors.

Processors 1870, 1880 each exchange information with a chipset 1890 via individual P-P interfaces 1852, 1854 using point to point interface circuits 1876, 1894, 1886, 1898. Chipset 1890 also exchanges information with a high-performance graphics circuit 1838 via an interface circuit 1892 along a high-performance graphics interconnect 1839.

A shared cache (not shown) may be included in either processor or outside of both processors; yet connected with the processors via P-P interconnect, such that either or both processors' local cache information may be stored in the shared cache if a processor is placed into a low power mode.

Chipset 1890 may be coupled to a first bus 1816 via an interface 1896. In one embodiment, first bus 1816 may be a Peripheral Component Interconnect (PCI) bus, or a bus such as a PCI Express bus or another third generation I/O interconnect bus, although the scope of the present invention is not so limited.

As shown in FIG. 18, various I/O devices 1814 are coupled to first bus 1816, along with a bus bridge 1818 which couples first bus 1816 to a second bus 1820. In one embodiment, second bus 1820 includes a low pin count (LPC) bus. Various devices are coupled to second bus 1820 including, for example, a keyboard and/or mouse 1822, communication devices 1827 and a storage unit 1828 such as a disk drive or other mass storage device which often includes instructions/code and data 1830, in one embodiment. Further, an audio I/O 1824 is shown coupled to second bus 1820. Note that other architectures are possible, where the included components and interconnect architectures vary. For example, instead of the point-to-point architecture of FIG. 18, a system may implement a multi-drop bus or other such architecture.

Figure 19:
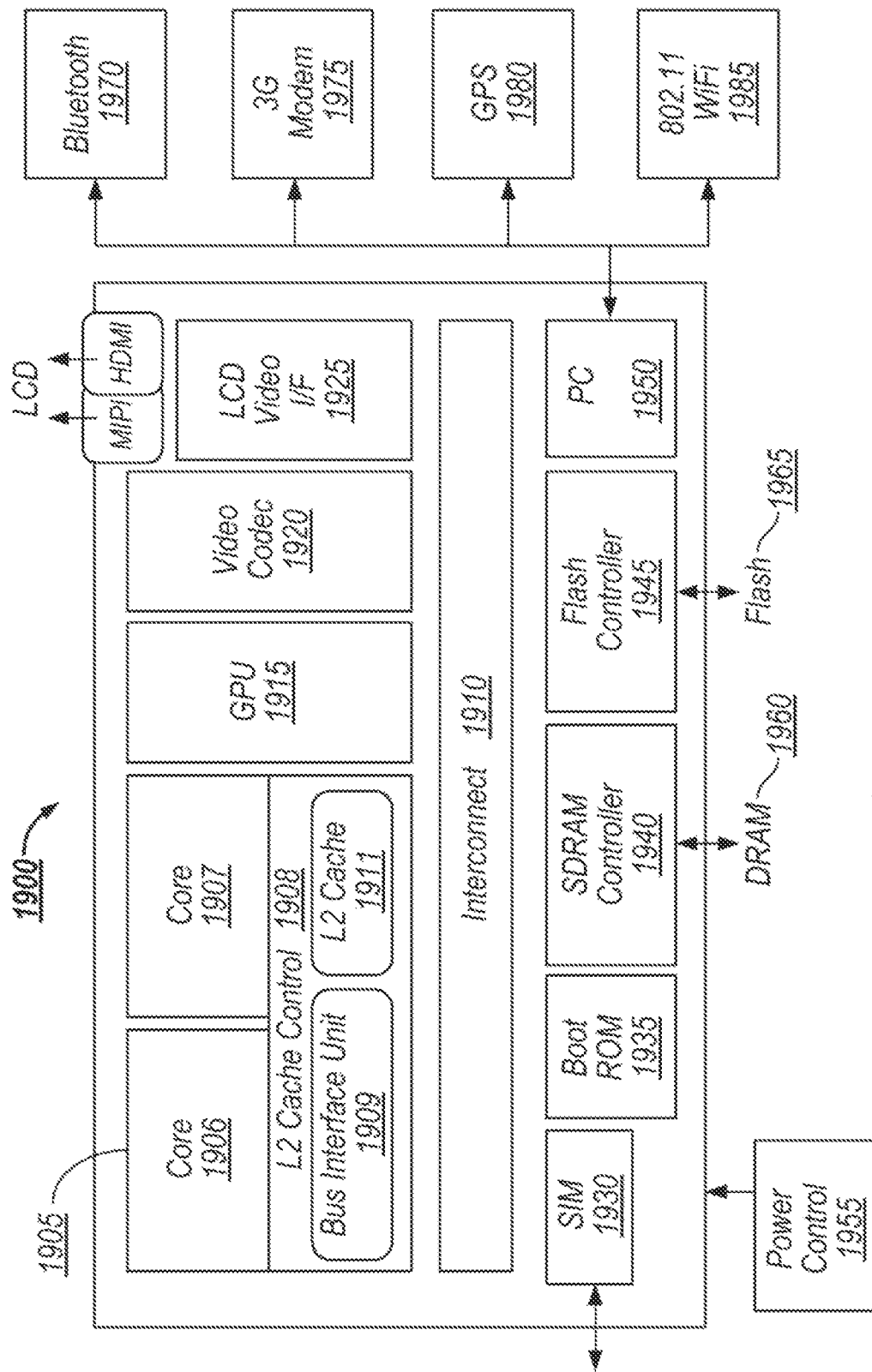
FIG. 19 illustrates an example system implemented as system on chip (SoC).

Turning next to FIG. 19, an embodiment of a system on-chip (SOC) design in accordance with the inventions is depicted. As a specific illustrative example, SOC 1900 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1900 includes 2 cores—1906 and 1907. Similar to the discussion above, cores 1906 and 1907 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1906 and 1907 are coupled to cache control 1908 that is associated with bus interface unit 1909 and L2 cache 1911 to communicate with other parts of system 1900. Interconnect 1910 includes an on-chip interconnect, such as an IOSF, AMBA, or other interconnect discussed above, which potentially implements one or more aspects of described herein.

Interface 1910 provides communication channels to the other components, such as a Subscriber Identity Module (SIM) 1930 to interface with a SIM card, a boot rom 1935 to hold boot code for execution by cores 1906 and 1907 to initialize and boot SOC 1900, a SDRAM controller 1940 to interface with external memory (e.g. DRAM 1960), a flash controller 1945 to interface with non-volatile memory (e.g. Flash 1965), a peripheral control 1950 (e.g. Serial Peripheral Interface) to interface with peripherals, video codecs 1920 and Video interface 1925 to display and receive input (e.g. touch enabled input), GPU 1915 to perform graphics related computations, etc. Any of these interfaces may incorporate aspects of the invention described herein.

In addition, the system illustrates peripherals for communication, such as a Bluetooth module 1970, 3G modem 1975, GPS 1985, and WiFi 1985. Note as stated above, a UE includes a radio for communication. As a result, these peripheral communication modules are not all required. However, in a UE some form a radio for external communication is to be included.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. One or more embodiments may provide an apparatus, a system, a machine readable storage, a machine readable medium, hardware- and/or software-based logic, and a method to provide a channel based on a Peripheral Component Interconnect (PCI) Express (PCIe) protocol to support a bit rate of at least 16 gigatransfer per second (GT/s), where the channel comprises two connectors and has a length greater than twelve inches.

In at least one example, the channel includes at least one via, and a stub of the via is at least partially removed.

In at least one example, the via is backdrilled to remove the stub.

In at least one example, the via is a via of a first one of the connectors.

In at least one example, each via utilized by the connector to connect to a first device is backdrilled.

In at least one example, vias of a second one of the connectors utilized to connect to a second device are backdrilled.

In at least one example, the via is a via of a processor socket.

In at least one example, each lane of the channel includes a corresponding portion of a respective processor socket, and each of the processor sockets corresponding to a lane of the channel having a via stub is backdrilled.

In at least one example, a low loss circuit board is provided and the channel is implemented at least in part on the circuit board.

In at least one example, the low loss circuit board has trace differential insertion loss of less In at least one example, gain is applied at a receiver front end of the channel.

In at least one example, the gain comprises approximately 6 dB.

In at least one example, gain is applied to a continuous time linear equalizer of the channel.

In at least one example, the combined gain applied to the receiver front end and the continuous time linear equalizer is approximately 6 dB.

In at least one example, the channel includes at least one via with a backdrilled stub, the channel is implemented at least in part on a low loss circuit board, and a combined gain of approximately 6 dB is applied at one or more of a receiver front end of the channel and a continuous time linear equalizer of the channel.

In at least one example, the length of the channel is at least twenty (20) inches.

One or more embodiments may provide an apparatus, a system, a machine readable storage, a machine readable medium, hardware- and/or software-based logic, and a method to send data at a bit rate of at least 16 GT/s on a channel comprising a two connector multi-lane link, where the length of the channel is greater than twelve inches.

In at least one example, the length of the channel is at least twenty (20) inches.

In at least one example, the channel comprises one or more vias and stubs of the vias are backdrilled.

In at least one example, the one or more vias are included on one or both of the two connectors.

In at least one example, the channel comprises processor sockets and the processor sockets include the vias.

In at least one example, the channel includes at least one via with a backdrilled stub, the channel is implemented at least in part on a low loss circuit board, and a combined gain of approximately 6 dB is applied at one or more of a receiver front end of the channel and a continuous time linear equalizer of the channel.

In at least one example, the channel comprises a PCIe-based channel.

One or more embodiments may provide an apparatus, a system, a machine readable storage, a machine readable medium, hardware- and/or software-based logic, and a method to receive data transmitted at a bit rate of at least 16 GT/s on a channel comprising a two connector multi-lane link, where the length of the channel is greater than twelve inches.

In at least one example, the length of the channel is at least twenty (20) inches.

In at least one example, the channel comprises one or more vias and stubs of the vias are backdrilled.

In at least one example, the one or more vias are included on one or both of the two connectors.

In at least one example, the channel comprises processor sockets and the processor sockets include the vias.

In at least one example, the channel includes at least one via with a backdrilled stub, the channel is implemented at least in part on a low loss circuit board, and a combined gain of approximately 6 dB is applied at one or more of a receiver front end of the channel and a continuous time linear equalizer of the channel.

In at least one example, the channel comprises a PCIe-based channel.

In at least one example, a system is provided that includes a first device and a second device communicatively coupled to the first device using an interconnect channel, where the interconnect channel comprises a Peripheral Component Interconnect (PCI) Express (PCIe) protocol-based link to support a bit rate of at least 16 GT/s, and the link includes two connectors and has a length greater than twelve inches.

In at least one example, the system comprises a server chipset.

In at least one example, the first device comprises a processor device.

One or more embodiments may provide an apparatus, a system, a machine readable storage, a machine readable medium, hardware- and/or software-based logic, and a method to identify a first lane error on a particular one of a plurality of lanes of a link based on detection of at least one erroneous symbol transmitted on the particular lane, and report the first lane error in a lane error register.

In at least one example, lane errors reported in the lane error register identify the corresponding lane in the plurality of lanes.

In at least one example, a second lane error is identified on the link based on detection of an erroneous sync header on at least one of the plurality of lanes, and the second lane error is reported in the lane error register.

In at least one example, a third lane error is identified based on determination of a parity information mismatch for a data stream transmitted over the link, and the third lane error is reported in the lane error register.

In at least one example, parity information is received in a SKP ordered set (SKP OS).

In at least one example, the I/O logic comprises physical layer logic.

In at least one example, the erroneous symbol comprises an error to a symbol included in a SKP OS.

In at least one example, the erroneous symbol comprises a non-SKP OS symbol detected between a first SLP OS symbol in the SKP OS and a SLP END marker in the SKP OS.

In at least one example, the erroneous symbol comprises a SKP END placed in a symbol other than symbols 8, 12, 16, 20, or 24 of the SKP OS.

In at least one example, the erroneous symbol comprises a first symbol of a framing token.

In at least one example, the framing token comprises a PCIe framing token.

In at least one example, the framing token comprises at least one of a logical idle token (IDL), a start of data link layer packet (DLLP) data token (SDP), a start of transaction layer packet (TLP) data token (STP), and an end bad TLP token (EDB).

In at least one example, the erroneous symbol comprises an erroneous IDL token symbol.

In at least one example, a first IDL token is included in a particular Lane n in the plurality of lanes and the erroneous symbol comprises a non-IDL symbol detected in any one of Lanes n+1, n+2, and n+3 in the plurality of lanes.

In at least one example, the erroneous symbol comprises an EDB token symbol.

In at least one example, a first EDB token follows a TLP on a particular Lane n in the plurality of lanes and the erroneous symbol comprises a non-EDB symbol detected in any one of Lanes n+1, n+2, and n+3 in the plurality of lanes.

In at least one example, the erroneous symbol comprises a symbol of an EDB token and the EDB token follows a framing token other than an SDP token.

In at least one example, the erroneous symbol comprises an SDP token symbol.

In at least one example, a first symbol of an SDP token is included in a particular Lane n in the plurality of lanes and the erroneous symbol comprises a non-SDP symbol detected in a Lane n+1 in the plurality of lanes.

In at least one example, the lane error register comprises a PCIe Lane Error Status (LES) register.

In at least one example, the link comprises a PCIe-compliant link.

In at least one example, a second lane error is identified on the link based on detection of an ordered set block lacking a preceding EDS token.

In at least one example, a lane error based on detection of an error in any one of an ordered set symbol, an IDL token symbol, an SDP token symbol, an STP token symbol, and an EDB token symbol is to be identified and reported.

In at least one example, the lane error register is monitored to identify lane errors involving the particular lane, and it can be determined that the particular lane is faulty based on a plurality of errors identified for the particular lane in the lane error register.

In at least one example, determining that the particular lane is faulty comprises a statistical analysis the plurality of errors.

One or more embodiments may provide an apparatus, a system, a machine readable storage, a machine readable medium, hardware- and/or software-based logic, and a method to identify that a link is to exit an active state, where the link comprises a plurality of lanes, maintain parity information for the lanes based on data previously sent over the link, and send an indication of the parity information prior to the exit from the active state.

In at least one example, the indication of the parity information is sent in response to the exit.

In at least one example, the indication of the parity information is sent in an ordered set.

In at least one example, the indication of the parity information for each lane is included in a respective parity bit for each lane included in the ordered set.

In at least one example, the ordered set comprises a PCIe SKP OS.

In at least one example, the link is to exit the active state based on a link recovery.

In at least one example, the link recovery is based on a detected error on the link.

In at least one example, the error comprises a framing token error.

One or more embodiments may provide an apparatus, a system, a machine readable storage, a machine readable medium, hardware- and/or software-based logic, and a method to transmit data on a link comprising a plurality of lanes, maintain parity information for each of the lanes based on the transmitted data, identify that the link is to exit an active state, and send the parity information prior to the exit from the active state.

One or more embodiments may provide an apparatus, a system, a machine readable storage, a machine readable medium, hardware- and/or software-based logic, and a method to maintain first parity information for each of a plurality of lanes of a link based on data previously sent over the link, receive second parity information in response to an event that causes the link to exit an active state where the second parity information is caused to be sent prior to the exit from the active state. The first parity information is compared with the second information to identify potential lane errors on one or more of the lanes.

In at least one example, the second parity information is included in an ordered set.

In at least one example, the second parity information is included in parity bits included in the ordered set.

In at least one example, the ordered set comprises a SKP OS.

In at least one example, the link is to exit the active state based on a recovery of the link.

In at least one example, the recovery is triggered by an error detected on the link.

In at least one example, the error comprises a framing token error.

In at least one example, potential lane errors are reported to a lane error register.

In at least one example, the lane error register comprises an LES register.

In at least one example, the event comprises an error detected on the link.

In at least one example, a recovery of the link is to be triggered based on the error and the recovery causes the link to exit the active state.

In at least one example, potential lane errors are identified based on detecting that the first parity information does not match the second parity information.

One or more embodiments may provide an apparatus, a system, a machine readable storage, a machine readable medium, hardware- and/or software-based logic, and a method to receive data over a link comprising a plurality of lanes, maintain first parity information for each of the lanes based on the data, receive second parity information in response to an event, where the event is to cause the link to exit an active state and the second parity information is caused to be sent prior to the exit from the active state, and compare the first parity information with the second information to identify potential lane errors on one or more of the lanes.

One or more embodiments may provide an apparatus, a system, a machine readable storage, a machine readable medium, hardware- and/or software-based logic, and a method to maintain parity information for each of a plurality of lanes of a link based on a first portion of data transmitted over the link, where the parity information is to be maintained through a recovery of the link, and resume calculation of the parity information following recovery of the link, where the parity information is further based on a second portion of data transmitted over the link and the second portion of data the recovery is considered persistently.

In at least one example, the first portion of the data corresponds to a first data block, and the second portion of the data corresponds to a different second data block.

In at least one example, the first data block is interrupted by the recovery and the second block begins following the recovery.

In at least one example, the recovery is based on an error detected on the link.

In at least one example, an indication of the parity information is sent to a receiver device that is calculated based on the first and second portions of the data.

In at least one example, the parity information comprises first parity information and I/O logic is further to receive, from a transmitter device, an indication of second parity information calculated by the transmitted device based on the first and second portions of the data, and compare the indication of the second parity information with the first parity information.

In at least one example, it is determined whether potential errors exist on one or more of the plurality of lanes based on a comparison of the indication of the second parity information with the first parity information.

In at least one example, the potential errors are reported in a lane error register.

In at least one example, the lane error register comprises a PCIe LES register.

In at least one example, the indication of the second parity information is included in a SKP OS.

In at least one example, the indication of the second parity information comprises parity bits of the SKP OS.

In at least one example, the link comprises a PCIe-compliant link.

One or more embodiments may provide an apparatus, a system, a machine readable storage, a machine readable medium, hardware- and/or software-based logic, and a method to transmit first data on a link comprising a plurality of lanes, determine parity information for each of the lanes based on the transmitted first data, participate in a recovery of the link, where the parity information is maintained through the recovery of the link, transmit second data on the link following the recovery of the link, and update the parity information to generate updated parity information, where the updated parity information is based on the first data and the second data.

One or more embodiments may provide an apparatus, a system, a machine readable storage, a machine readable medium, hardware- and/or software-based logic, and a method to receive first data from a device, where the first data is received on a link comprising a plurality of lanes, determine parity information for each of the lanes based on the received first data, participate in a recovery of the link, where the parity information is maintained through the recovery of the link, receive second data on the link from the device following the recovery of the link, and update the parity information to generate updated parity information, where the updated parity information is based on the first data and the second data.

In at least one example, the particular parity information can be compared with other parity information to determine one or more potential lane errors.

In at least one example, the other parity information is included in a SKP OS.

In at least one example, the other parity information can be identified from parity bits included in the SKP OS.

One or more embodiments may provide an apparatus, a system, a machine readable storage, a machine readable medium, hardware- and/or software-based logic, and a method to receive first data from a device, where the first data is received on a link comprising a plurality of lanes, determine parity information for each of the lanes based on the received first data, participate in a recovery of the link, where the parity information is to be maintained through the recovery of the link, receive second data on the link from the device following the recovery of the link, and update the parity information to generate updated parity information, where the updated parity information is to be based on the first data and the second data.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a port transmitter to compute parity corresponding to each of a plurality of lanes of a link, wherein the parity corresponding to a lane comprises an even parity of payloads of data blocks communicated by the lane;
   I/O logic to generate a SKP ordered set (OS) associated with the particular lane, wherein the SKP OS is to comprise a data parity bit, and the data parity bit indicates the even parity of the particular lane; and
   a transmitter to send the SKP OS on the particular lane.

2. The apparatus of claim 1, wherein the parity is computed independently of all other lanes.

3. The apparatus of claim 1, wherein a respective SKP OS is to be generated for each of the plurality of lanes of the link and include a data parity bit to indicate parity computed for the corresponding lane.

4. The apparatus of claim 1, further comprising a receiver to receive a start of data sequence (SDS) OS, wherein the parity is to be computed based on a set of payloads of data blocks communicated beginning with receipt of the SDS OS.

5. The apparatus of claim 4, wherein the SDS OS initializes computation of the parity for the plurality of lanes.

6. The apparatus of claim 1, wherein the SKP OS is sent to correspond with an exit from an active link state.

7. The apparatus of claim 6, wherein the exit from the active link state is based on a link recovery.

8. The apparatus of claim 1, wherein the SKP OS comprises a format according to a Peripheral Component Interconnect Express (PCIe)-based protocol.

9. An apparatus comprising:
a receiver to:
  receive data blocks on a link comprising a plurality of lanes; and
  receive a SKP ordered set (OS) on a particular one of the plurality of lanes, wherein the SKP OS is associated with the particular lane, the SKP OS comprises a data parity bit, and the data parity bit indicates a first even parity value computed for the data blocks sent on the particular lane by a transmitting device;
a parity calculator to compute a second parity value for payloads of the data blocks; and
parity comparison logic to compare the first parity value with the second parity value to determine whether an error condition exists.

10. The apparatus of claim 9, wherein the first parity value is computed independently of parity values computer for data blocks sent on other lanes in the plurality of lanes.

11. The apparatus of claim 9, wherein a respective SKP OS is to be generated for each of the plurality of lanes of the link and include a data parity bit to indicate parity computed for data blocks sent on the corresponding lane.

12. The apparatus of claim 9, further comprising a transmitter to transmit a start of data sequence (SDS) OS, wherein the parity is to be computed based on a set of payloads of data blocks communicated following transmittal of the SDS OS.

13. The apparatus of claim 12, wherein the SDS OS initializes computation of the parity for the plurality of lanes.

14. The apparatus of claim 9, wherein the SKP OS corresponds to an exit from an active link state.

15. The apparatus of claim 14, wherein the exit from the active link state is based on a link recovery.

16. The apparatus of claim 9, wherein the SKP OS comprises a format according to a Peripheral Component Interconnect Express (PCIe)-based protocol.

17. A method comprising:
computing parity corresponding to each of a plurality of lanes of a link, wherein the parity corresponding to a lane comprises an even parity of payloads of data blocks communicated by the lane;
generating a SKP ordered set (OS) associated with the particular lane, wherein the SKP OS is to comprise a data parity bit, and the data parity bit indicates the even parity of the particular lane; and
sending the SKP OS on the particular lane.

18. A system comprising:
means for computing parity corresponding to each of a plurality of lanes of a link, wherein the parity corresponding to a lane comprises an even parity of payloads of data blocks communicated by the lane;
means for generating a SKP ordered set (OS) associated with the particular lane, wherein the SKP OS is to comprise a data parity bit, and the data parity bit indicates the even parity of the particular lane; and
means for sending the SKP OS on the particular lane.

19. A system comprising:
a first device; and
a second device connected to the first device by a point-to-point serial data link, wherein the data link comprises a plurality of lanes, and the second device comprises:
  a port transmitter to compute parity corresponding to each of the plurality of lanes of the data link, wherein the parity corresponding to a lane comprises an even parity of payloads of data blocks communicated on the lane;
  I/O logic to generate a SKP ordered set (OS) associated with the particular lane, wherein the SKP OS is to comprise a data parity bit, and the data parity bit indicates the even parity of the particular lane; and
  a transmitter to send the SKP OS on the particular lane to the first device.

20. The system of claim 19, wherein the second device comprises a processor device.

21. The system of claim 19, wherein the second device comprises a root port.

22. The system of claim 19, wherein the first device comprises a graphics processor.

23. The system of claim 19, wherein the first device comprises a memory controller.

* * * * *